US012641959B2

(12) United States Patent
Kim et al.

(10) Patent No.: US 12,641,959 B2
(45) Date of Patent: May 26, 2026

(54) DISPLAY APPARATUS AND METHOD OF MANUFACTURING DISPLAY APPARATUS

(71) Applicant: SAMSUNG DISPLAY CO., LTD., Yongin-si (KR)

(72) Inventors: Minjae Kim, Yongin-si (KR); Inok Kim, Yongin-si (KR); Yousik Shin, Yongin-si (KR); Youyoung Jin, Yongin-si (KR); Jaecheol Park, Yongin-si (KR); Keunchan Oh, Yongin-si (KR); Changhun Lee, Yongin-si (KR); Sunkyu Joo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 582 days.

(21) Appl. No.: 18/061,946

(22) Filed: Dec. 5, 2022

(65) Prior Publication Data

US 2023/0180533 A1 Jun. 8, 2023

(30) Foreign Application Priority Data

Dec. 6, 2021 (KR) ........................ 10-2021-0173175

(51) Int. Cl.
| | |
|---|---|
| *H10K 59/122* | (2023.01) |
| *H10K 50/84* | (2023.01) |
| *H10K 59/38* | (2023.01) |
| *H10K 71/00* | (2023.01) |
| *H10K 59/12* | (2023.01) |

(52) U.S. Cl.
CPC ........... *H10K 59/122* (2023.02); *H10K 50/84* (2023.02); *H10K 59/38* (2023.02); *H10K 71/00* (2023.02); *H10K 59/1201* (2023.02)

(58) Field of Classification Search
None
See application file for complete search history.

(56) References Cited

U.S. PATENT DOCUMENTS

| | | | |
|---|---|---|---|
| 7,483,113 | B2 | 1/2009 | Paik et al. |
| 7,751,019 | B2 | 7/2010 | Cho et al. |
| 11,903,237 | B2 | 2/2024 | Joo et al. |
| 2021/0005672 | A1 | 1/2021 | Lee et al. |

FOREIGN PATENT DOCUMENTS

| | | |
|---|---|---|
| KR | 10-2007-0025457 A | 3/2007 |
| KR | 10-2012-0001719 A | 1/2012 |
| KR | 10-1188602 | 10/2012 |
| KR | 10-1192783 B1 | 10/2012 |
| KR | 10-2021-0003993 A | 1/2021 |
| KR | 10-2021-0129309 A | 10/2021 |

*Primary Examiner* — Michelle Mandala
(74) *Attorney, Agent, or Firm* — Womble Bond Dickinson (US) LLP

(57) ABSTRACT

A display apparatus includes: a lower substrate; a light-emitting element on the lower substrate and including an emission layer; an upper substrate over the lower substrate with the light-emitting element therebetween; a bank on a lower surface of the upper substrate facing the lower substrate, the bank including a central opening and a peripheral opening; a functional layer in the central opening and including at least one of a color-converting material or a scatterer; and a column spacer on the bank and facing the lower substrate. A distance from an outer surface of the column spacer to an inner surface of the bank is 15 μm or more in a plan view. The inner surface of the bank defines the peripheral opening.

10 Claims, 17 Drawing Sheets

| | COMPARATIVE EXAMPLE | EMBODIMENT |
|---|---|---|
| PLAN VIEW | | |
| CROSS-SECTIONAL VIEW | | |

DISPLAY APPARATUS AND METHOD OF MANUFACTURING DISPLAY APPARATUS

CROSS-REFERENCE TO RELATED APPLICATION

This application claims priority to and the benefit of Korean Patent Application No. 10-2021-0173175, filed on Dec. 6, 2021, in the Korean Intellectual Property Office (KIPO), the entire disclosure of which is incorporated by reference herein.

BACKGROUND

1. Field

One or more embodiments relate to a display apparatus and a method of manufacturing a display apparatus.

2. Description of the Related Art

A display apparatus may visually display data. A display apparatus may be used as a display part in miniaturized products such as mobile phones, and used as a display part in large-scale products such as televisions.

A display apparatus may include a plurality of sub-pixels that receive electrical signals and emit light to display images to the outside. For a full-color display apparatus, a plurality of sub-pixels may emit light of different colors. For this purpose, at least some of the plurality of sub-pixels may have a filter unit configured to convert color. Light in a first wavelength band generated from some sub-pixels may be converted to light in a second wavelength band while passing through the filter unit, and then, output to the outside.

SUMMARY

A full-color display apparatus may include a light-emitting panel and a color panel. The light-emitting panel may include light-emitting elements configured to emit light, and the color panel may have a filter unit configured to convert a color of light emitted from a light-emitting element. A filling layer may be disposed between the light-emitting panel and the color panel. Aspects of one or more embodiments of the present disclosure are directed to a display apparatus including a column space such that a plurality of light-emitting elements and a plurality of filter units maintain a uniform interval entirely, and a method of manufacturing a display apparatus.

Additional aspects will be set forth in part in the description which follows and, in part, will be apparent from the description, or may be learned by practice of the presented embodiments of the disclosure.

According to one or more embodiments, a display apparatus includes a lower substrate, a light-emitting element on the lower substrate and including an emission layer, an upper substrate over the lower substrate with the light-emitting element therebetween, a bank on a lower surface of the upper substrate facing the lower substrate, the bank including a central opening and a peripheral opening, a functional layer in the central opening and including at least one of a color-converting material or a scatterer, and a column spacer on the bank and facing the lower substrate. A distance from an outer surface of the column spacer to an inner surface of the bank is 15 μm or more in a plan view. The inner surface of the bank defines the peripheral opening.

The distance from the outer surface of the column spacer to the inner surface of the bank defining the peripheral opening may be in a range of about 15 μm to about 16 μm.

The peripheral opening may include a first peripheral opening and a second peripheral opening. In a plan view, the column spacer may be located between the first peripheral opening and the second peripheral opening. A difference between a first distance and a width of the column spacer may be 30 μm or more, the first distance being a distance between a first inner surface of the bank and a second inner surface of the bank. The first inner surface of the bank defines the first peripheral opening. The second inner surface of the bank defines the second peripheral opening.

The peripheral opening may further include a third peripheral opening adjacent to the first peripheral opening. A second distance between the first inner surface and a third inner surface of the bank may be 30 μm or less in a plan view. The third inner surface of the bank defines the third peripheral opening.

The bank may further include a planarization region having a first surface that is flat, an opening region overlapping the peripheral opening, and a curved area arranged between the planarization region and the opening region, and having a second surface that is curved, wherein the column spacer may be on the first surface.

The peripheral opening may include a plurality of peripheral openings. In a plan view, the column spacer may be surrounded by the plurality of peripheral openings.

The peripheral opening may include a plurality of peripheral openings. The plurality of peripheral openings may surround the central opening.

The display apparatus may further include a color filter layer located between the upper substrate and the bank. The color filter layer may include a first color filter, a second color filter, and a third color filter to pass light in different wavelength bands from each other. The first color filter, the second color filter, and the third color filter may constitute a light-blocking unit overlapping the peripheral opening.

The display apparatus may further include an encapsulation layer covering the light-emitting element, and a filling layer located between the encapsulation layer and the bank. The column spacer may separate the encapsulation layer from the bank and pass through the filling layer.

The color-converting material may include quantum dots.

According to one or more embodiments, a method of manufacturing a display apparatus includes arranging, on an upper substrate, a bank including a peripheral opening, and forming a column spacer on the bank. A distance from an outer surface of the column spacer to an inner surface of the bank is 15 μm or more in a plan view. The inner surface of the bank defines the peripheral opening.

The distance from the outer surface of the column spacer to the inner surface of the bank may be in a range of about 15 μm to about 16 μm.

The peripheral opening may include a first peripheral opening and a second peripheral opening. In a plan view, the column spacer may be located between the first peripheral opening and the second peripheral opening. A difference between a first distance and a width of the column spacer may be 30 μm or more, the first distance being a distance between a first inner surface of the bank and a second inner surface of the bank. The first inner surface of the bank defines the first peripheral opening. The second inner surface of the bank defines the second peripheral opening.

The peripheral opening may further include a third peripheral opening adjacent to the first peripheral opening. A second distance between the first inner surface and a third inner surface of the bank may be 30 µm or less in a plan view. The third inner surface of the bank defines the third peripheral opening.

The forming of the column spacer on the bank may include forming an organic material layer on the bank, aligning an exposer and exposing the organic material layer, and forming the outer surface of the column spacer by developing and hardening the organic material layer.

The bank may further include a planarization region having a first surface that is flat, an opening region overlapping the peripheral opening, and a curved area arranged between the planarization region and the opening region, and having a second surface that is curved. The column spacer may be formed in the planarization region.

A distance from the upper substrate to a first upper surface of the organic material layer may be greater than a distance from the upper substrate to a second upper surface of the organic material layer. The first upper surface of the organic material layer overlaps the bank. The second upper surface of the organic material layer overlaps the peripheral opening.

The organic material layer may include a first material region overlapping the bank, a second material region overlapping the peripheral opening, and a third material region arranged between the first material region and the second material region and including an upper surface that is curved. The exposer may be aligned to overlap the first material region.

A color filter layer may be arranged between the upper substrate and the bank. The color filter layer may include a first color filter, a second color filter, and a third color filter to transmit light in different wavelength bands from each other. The first color filter, the second color filter, and the third color filter may constitute a light-blocking unit overlapping the peripheral opening.

The method may further include arranging the column spacer on an encapsulation layer. The column spacer may separate the encapsulation layer from the bank and pass through a filling layer.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 10 is a table for comparing a comparative example with an embodiment.

DETAILED DESCRIPTION

Figure 1:
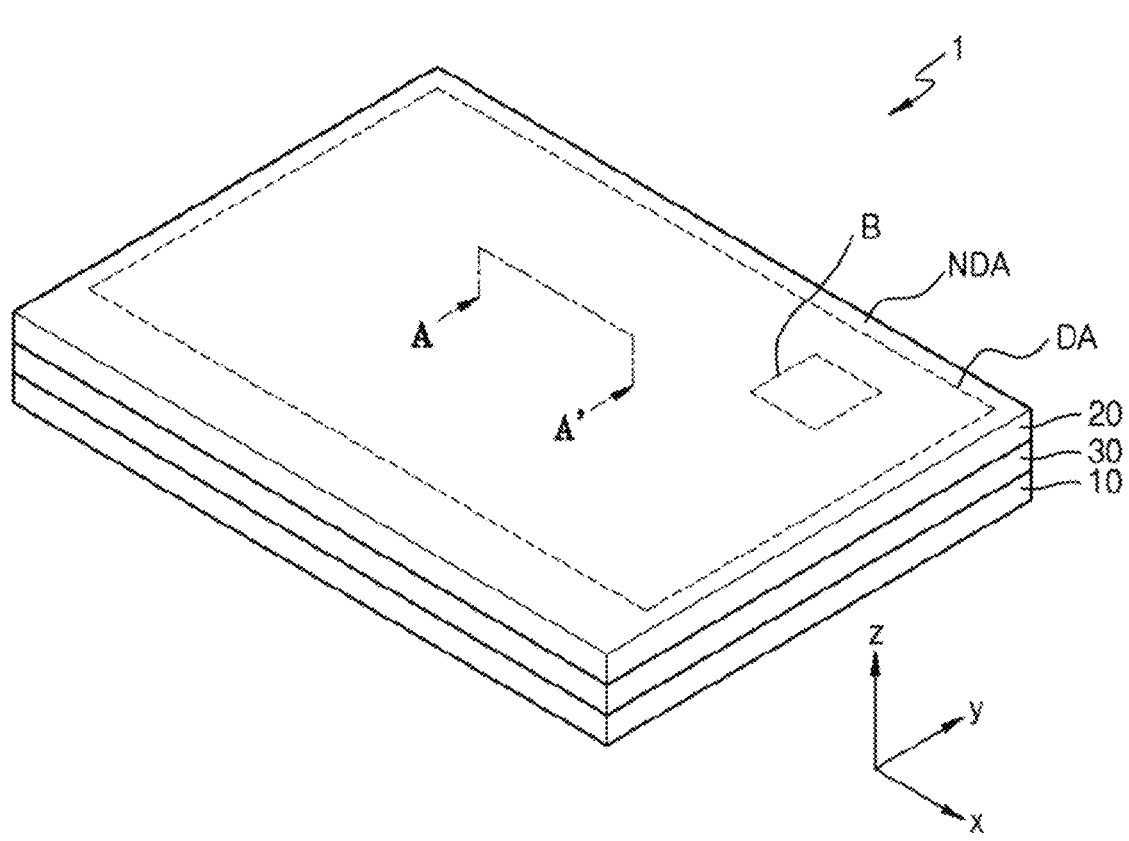
FIG. 1 is a perspective view of a display apparatus according to one or more embodiments.

Reference will now be made in more detail to embodiments, examples of which are illustrated in the accompanying drawings. Like reference numerals refer to like elements throughout, and duplicative descriptions thereof may not be provided. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various suitable changes and numerous embodiments, certain embodiments will be illustrated in the drawings and described in the written description. Effects and features of the disclosure, and methods for achieving them will be clarified with reference to embodiments described below in more detail with reference to the drawings. However, the disclosure is not limited to the following embodiments and may be embodied in various suitable forms.

Although the terms first, second, etc. may be used to describe various elements, these elements should not be limited by these terms. These terms are only used to distinguish one element from another element. For example, a first element may be referred to as a second element, and similarly, a second element may also be referred to as a first element without departing from the scope of the present disclosure.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, one or more intervening layers, regions, or components may be present.

Further, the use of "may" when describing embodiments of the present disclosure refers to "one or more embodiments of the present disclosure."

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and refers to within an acceptable range of deviation for the particular value as determined by one of ordinary skill in the art, considering the measurement in question and the error associated with measurement of the particular quantity (i.e., the limitations of the measurement system). For example, "about" may refer to within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Sizes of elements in the drawings may be exaggerated or reduced for convenience of explanation. For example, because sizes and thicknesses of elements in the drawings are arbitrarily illustrated for convenience of explanation, the disclosure is not limited thereto.

In the case where a certain embodiment may be implemented differently, a specific process order may be performed in the order different from the described order. As an example, two processes that are successively described may be substantially simultaneously performed or performed in the order opposite to the order described.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with one or more other layer, region, or component interposed therebetween.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic perspective view of a display apparatus 1 according to one or more embodiments.

Referring to FIG. 1, the display apparatus 1 may display images. The display apparatus 1 may display images by using a plurality of sub-pixels arranged in the display area DA. Each of the sub-pixels of the display apparatus 1 may be a region that may emit light of a preset color. The display apparatus 1 may display images by using light emitted from the plurality of sub-pixels. As an example, a sub-pixel may emit red light, green light, or blue light. As another example, the sub-pixel may emit red light, green light, blue light, or white light.

A non-display area NDA may be around (e.g., may surround) at least a portion of the display area DA. In one or more embodiments, the non-display area NDA may surround the display area DA (e.g., may surround the display area DA entirely). The non-display area NDA may be a region that does not display images.

As shown in FIG. 1, the display area DA may have a polygonal shape including a quadrangular shape. As an example, the display area DA may have a rectangular shape in which a horizontal length is greater than a vertical length, a rectangular shape in which a horizontal length is less than a vertical length, or a square shape. In one or more embodiments, the display area DA may have various suitable shapes such as ellipses or circles. In one or more embodiments, the display apparatus 1 may include a light-emitting panel 10, a color panel 20, and a filling layer 30. The light-emitting panel 10, the filling layer 30, and the color panel 20 may be stacked in a thickness direction (e.g., a z direction).

The display apparatus 1 having the above structure may be included in mobile phones, televisions, advertisement boards, tablet personal computers, notebook computers, and/or the like.

Figure 2:
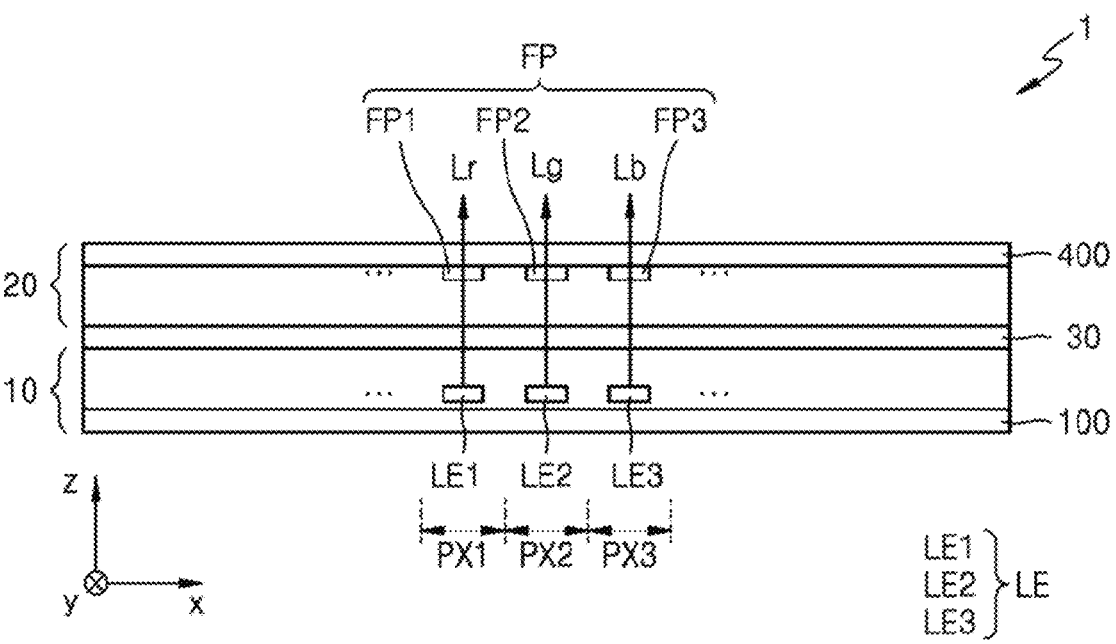
FIG. 2 is a schematic cross-sectional view of a display apparatus according to one or more embodiments.

FIG. 2 is a schematic perspective view of the display apparatus 1 according to one or more embodiments.

Referring to FIG. 2, the display apparatus 1 may include a first sub-pixel PX1, a second sub-pixel PX2, and a third sub-pixel PX3. The first sub-pixel PX1, the second sub-pixel PX2, and the third sub-pixel PX3 may be sub-pixels emitting light of different colors. As an example, the first sub-pixel PX1 may emit red light Lr, the second sub-pixel PX2 may emit green light Lg, and the third sub-pixel PX3 may emit blue light Lb.

The display apparatus 1 may include the light-emitting panel 10, the color panel 20, and the filling layer 30. The light-emitting panel 10 may include a lower substrate 100 and a light-emitting element LE. The light-emitting element LE may be, for example, an organic light-emitting diode. In one or more embodiments, each of the first sub-pixel PX1, the second sub-pixel PX2, and the third sub-pixel PX3 may include the light-emitting element LE. As an example, the first sub-pixel PX1 may include a first light-emitting element LE1. The first light-emitting element LE1 may be a first organic light-emitting diode. The first sub-pixel PX2 may include a second light-emitting element LE2. The second light-emitting element LE2 may be a second organic light-emitting diode. The third sub-pixel PX3 may include a third light-emitting element LE3. The third light-emitting element LE3 may be a third organic light-emitting diode.

The first light-emitting element LE1, the second light-emitting element LE2, and the third light-emitting element LE3 may emit light of the same color. In one or more embodiments, the first light-emitting element LE1, the second light-emitting element LE2, and the third light-emitting element LE3 may emit blue light.

The color panel 20 may include an upper substrate 400 and a filter unit FP. In one or more embodiments, the filter unit FP may include a first filter part FP1, a second filter part FP2, and a third filter part FP3. Light emitted from the first light-emitting element LE1 may pass through the first filter part FP1 and be emitted as red light Lr. Light emitted from the second light-emitting element LE2 may pass through the second filter part FP2 and be emitted as green light Lg. Light emitted from the third light-emitting element LE3 may pass through the third filter part FP3 and be emitted as blue light Lb.

The filter unit FP may include a functional layer and a color filter layer. In one or more embodiments, the functional layer may include a first quantum-dot layer, a second quantum-dot layer, and a transmission layer. In one or more embodiments, the color filter layer may include a first color filter, a second color filter, and a third color filter. The first filter part FP1 may include the first quantum-dot layer and a first color filter. The second filter part FP2 may include the second quantum-dot layer and a second color filter. The third filter part FP3 may include the transmission layer and a third color filter.

The filter unit FP may be directly disposed on the upper substrate 400. In this case, "being directly disposed on the upper substrate" may refer to that the color panel 20 is manufactured by directly forming the first color filter, the second color filter, and the third color filter on the upper substrate 400. Then, the color panel 20 may be bonded to the light-emitting panel 10 such that the first filter part FP1, the second filter part FP2, and the third filter part FP3 respectively face the first light-emitting element LE1, the second light-emitting element LE2, and the third light-emitting element LE3.

The filling layer 30 may be disposed between the light-emitting panel 10 and the color panel 20. The filling layer 30 may attach the light-emitting panel 10 to the color panel 20. In one or more embodiments, the filling layer 30 may include a thermosetting filling or a photocurable filler. In one or more embodiments, one of the light-emitting panel 10 and the color panel 20 may include a column spacer. As an example, the light-emitting panel 10 may include a column spacer protruding toward the color panel 20. As another example, the color panel 20 may include a column spacer protruding toward the light-emitting panel 10. Accordingly, a plurality of light-emitting elements LE and a plurality of filter units FP may each maintain a preset distance, and the display apparatus 1 may maintain uniform brightness regardless of positions.

Figure 3:
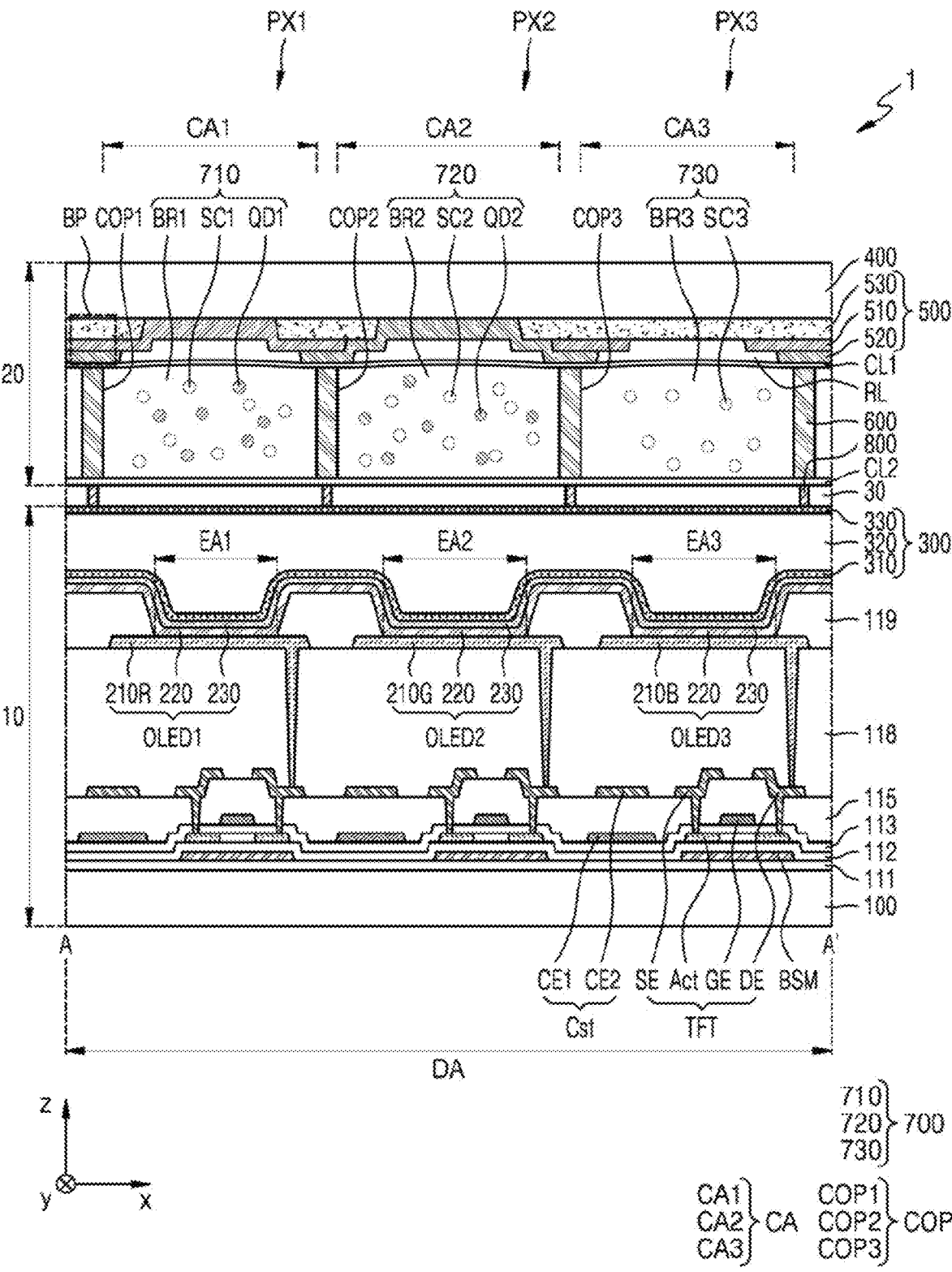
FIG. 3 is a schematic cross-sectional view of a display apparatus according to one or more embodiments.

FIG. 3 is a schematic cross-sectional view of the display apparatus 1 according to one or more embodiments. FIG. 3 is a cross-sectional view of the display apparatus 1, taken along the line A-A' of FIG. 1.

Referring to FIG. 3, the display apparatus 1 may include the first sub-pixel PX1, the second sub-pixel PX2, and the third sub-pixel PX3 arranged in the display area DA. The first sub-pixel PX1, the second sub-pixel PX2, and the third sub-pixel PX3 may be configured to emit light of different colors. As an example, the first sub-pixel PX1 may emit red light Lr, the second sub-pixel PX2 may emit green light Lg, and the third sub-pixel PX3 may emit blue light Lb.

In another embodiment, the display apparatus 1 may include more sub-pixels. Though it is shown in FIG. 3 that the first sub-pixel PX1, the second sub-pixel PX2, and the third sub-pixel PX3 are adjacent to each other, the first sub-pixel PX1, the second sub-pixel PX2, and the third sub-pixel PX3 may not be adjacent to each other in another embodiment.

The display apparatus 1 may include the light-emitting panel 10, the color panel 20, and the filling layer 30. The light-emitting panel 10 may include the lower substrate 100 and a light-emitting element. The light-emitting element is disposed on the lower substrate 100 and includes an emission layer 220. The light-emitting element may be an organic light-emitting diode. In one or more embodiments, the light-emitting panel 10 may include a first organic light-emitting diode OLED1, a second organic light-emitting diode OLED2, and a third organic light-emitting diode OLED3 each disposed over the lower substrate 100. The first organic light-emitting diode OLED1, the second organic light-emitting diode OLED2, and the third organic light-emitting diode OLED3 may each include the emission layer 220.

Hereinafter, a stack structure of the light-emitting panel 10 is described in more detail. In one or more embodiments, the light-emitting panel 10 may include the lower substrate 100, a first buffer layer 111, a bias electrode BSM, a second buffer layer 112, a thin-film transistor TFT, a storage capacitor Cst, a gate insulating layer 113, an interlayer insulating layer 115, a planarization layer 118, the light-emitting element, and an encapsulation layer 300. The thin-film transistor TFT may include a semiconductor layer Act, a gate electrode GE, a source electrode SE, and a drain electrode DE. The storage capacitor Cst may include a first electrode CE1 and a second electrode CE2.

The lower substrate 100 may include a glass material, a ceramic material, a metal, and/or a flexible or bendable material. In the case where the lower substrate 100 is flexible or bendable, the lower substrate 100 may include a polymer resin including polyethersulfone, polyacrylate, polyetherimide, polyethylene naphthalate, polyethylene terephthalate, polyphenylene sulfide, polyarylate, polyimide, polycarbonate, and/or cellulose acetate propionate. The lower substrate 100 may have a single-layer structure or a multi-layer structure of the above materials, and may further include an inorganic layer in the case of the multi-layer structure. In one or more embodiments, the lower substrate 100 may have a structure of an organic material/an inorganic material/an organic material.

A barrier layer may be further disposed between the lower substrate 100 and the first buffer layer 111. The barrier layer may prevent or reduce the penetration of impurities from the lower substrate 100 and/or the like to the semiconductor layer Act. The barrier layer may include an inorganic material, an organic material, or an organic/inorganic composite material, and include a single layer or a multi-layer including an inorganic material and an organic material, the inorganic material including oxide or nitride.

The bias electrode BSM may be disposed on the first buffer layer 111 to correspond to the thin-film transistor TFT. In one or more embodiments, a voltage may be applied to the bias electrode BSM. In one or more embodiments, the bias electrode BSM may prevent or substantially prevent external light reaching the semiconductor layer Act. Accordingly, the characteristics of the thin-film transistor TFT may be stabilized. In one or more embodiments, the bias electrode BSM may not be provided depending on the embodiment.

The semiconductor layer Act may be disposed on the second buffer layer 112. The semiconductor layer Act may include amorphous silicon or polycrystalline silicon. In another embodiment, the semiconductor layer Act may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), or zinc (Zn). In another embodiment, the semiconductor layer Act may include Zn-oxide-based material and include Zn-oxide, In—Zn oxide, and/or Ga—In—Zn oxide. In another embodiment, the semiconductor layer Act may include In—Ga—Zn—O (IGZO), In—Sn—Zn—O (ITZO), or In—Ga—Sn—Zn—O (IGTZO) semiconductor containing metal such as indium (In), gallium (Ga), and/or stannum (Sn) in ZnO. The semiconductor layer Act may include a channel region, a drain region, and a source region. The drain region and the source region may be at opposite sides of the channel region. The semiconductor layer Act may include a single layer or a multi-layer.

The gate electrode GE may be disposed over the semiconductor layer Act with a gate insulating layer 113 therebetween. The gate electrode GE may overlap at least a portion of the semiconductor layer Act. The gate electrode GE may include at least one of molybdenum (Mo), aluminum (Al), copper (Cu), titanium (Ti) and/or the like and include a single layer or a multi-layer. As an example, the gate electrode GE may be a single Mo layer. The first electrode CE1 of the storage capacitor Cst may be disposed on or at the same layer as the gate electrode GE. The first electrode CE1 may include the same material as that of the gate electrode GE.

Though it is shown in FIG. 3 that the gate electrode GE of the thin-film transistor TFT is disposed separate from the first electrode CE1 of the storage capacitor Cst, the storage capacitor Cst may overlap the thin-film transistor TFT. In this case, the first gate electrode GE1 of the thin-film transistor TFT may serve as the first electrode CE1 of the storage capacitor Cst.

The interlayer insulating layer 115 may be provided to cover the gate electrode GE and the first electrode CE1 of the storage capacitor Cst. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). Zinc oxide ($ZnO_x$) may be zinc oxide (ZnO) and/or zinc peroxide ($ZnO_2$).

The second electrode CE2 of the storage capacitor Cst, the source electrode SE, and the drain electrode DE may be disposed on the interlayer insulating layer 115. The second electrode CE2 of the storage capacitor Cst, the source electrode SE, and the drain electrode DE may each include a conductive material including molybdenum (Mo), aluminum (Al), copper (Cu), titanium (Ti), and/or the like, and include a multi-layer or a single layer including the above materials. As an example, the second electrode CE2, the source electrode SE and the drain electrode DE may each have a multi-layer structure of Ti/Al/Ti. The source electrode SE and the drain electrode DE may be connected to the source region and the drain region of the semiconductor layer Act through respective contact holes.

The second electrode CE2 of the storage capacitor Cst may overlap the first electrode CE1 with the interlayer insulating layer 115 therebetween and constitute the storage capacitor Cst. In this case, the interlayer insulating layer 115 may serve as a dielectric layer of the storage capacitor Cst.

The planarization layer 118 may be disposed on the second electrode CE2 of the storage capacitor Cst, the source electrode SE, and the drain electrode DE. The planarization layer 118 may include a single layer or a multi-layer including an organic material and provide a flat upper surface. The planarization layer 118 may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and/or a blend thereof.

The light-emitting element may be disposed on the planarization layer 118. The light-emitting element may include a pixel electrode, the emission layer 220, and an opposite electrode 230. In one or more embodiments, the first organic light-emitting diode OLED1, the second organic light-emitting diode OLED2, and the third organic light-emitting diode OLED3 may be disposed on the planarization layer 118. The first organic light-emitting diode OLED1, the second organic light-emitting diode OLED2, and the third organic light-emitting diode OLED3 may respectively include a first pixel electrode 210R, a second pixel electrode 210G, and a third pixel electrode 2108. In one or more embodiments, the first organic light-emitting diode OLED1, the second organic light-emitting diode OLED2, and the third organic light-emitting diode OLED3 may include the emission layer 220 and the opposite electrode 230 in common.

The first pixel electrode 210R, the second pixel electrode 210G, and the third pixel electrode 2108 may be disposed on the planarization layer 118. The first pixel electrode 210R, the second pixel electrode 210G, and the third pixel electrode 210B may each be connected to the thin-film transistor TFT. The first pixel electrode 210R, the second pixel electrode 210G, and the third pixel electrode 2108 may each include a (semi) light-transmissive electrode or a reflective electrode. In one or more embodiments, the first pixel electrode 210R, the second pixel electrode 210G, and the third pixel electrode 210B may each include a reflective layer and a transparent or semi-transparent electrode layer. The reflective layer may include silver (Ag), magnesium (Mg), aluminum (Al), platinum (Pt), palladium (Pd), gold (Au), nickel (Ni), neodymium (Nd), iridium (Ir), chromium (Cr), or a compound thereof. The transparent or semi-transparent electrode layer may include at least one of indium tin oxide (ITO), indium zinc oxide (IZO), zinc oxide (ZnO), indium oxide ($In_2O_3$), indium gallium oxide (IGO), or aluminum zinc oxide (AZO). In one or more embodiments, the first pixel electrode 210R, the second pixel electrode 210G, and the third pixel electrode 2108 may each include ITO/Ag/ITO.

A pixel-defining layer 119 may be disposed on the planarization layer 118. The pixel-defining layer 119 may include openings respectively exposing the central portions of the first pixel electrode 210R, the second pixel electrode 210G, and the third pixel electrode 2108. The pixel-defining layer 119 may cover the edges of the first pixel electrode 210R, the second pixel electrode 210G, and the third pixel electrode 2108. The pixel-defining layer 119 may prevent or substantially prevent an arc and/or the like from occurring at the edges of the first pixel electrode 210R, the second pixel electrode 210G, and the third pixel electrode 2108 by increasing a distance between the edges of the first pixel electrode 210R, the second pixel electrode 210G, and the third pixel electrode 210B and the opposite electrode 230 over the first pixel electrode 210R, the second pixel electrode 210G, and the third pixel electrode 210B. The pixel-defining layer 119 may include an organic insulating material such as polyimide, an acrylic resin, benzocyclobutene, a phenolic resin, and/or the like and be formed by using spin coating and/or the like.

The emission layer 220 of the first organic light-emitting diode OLED1, the second organic light-emitting diode OLED2, and the third organic light-emitting diode OLED3 may include a fluorescent or phosphorous material that emits red, green, blue, or white light. The emission layer 220 may include a polymer organic material or a low molecular weight organic material. Functional layers may be selectively further arranged under and on the emission layer 220. The functional layers include a hole transport layer (HTL), a hole injection layer (HIL), an electron transport layer (ETL), and an electron injection layer (EIL). Though it is shown in FIG. 3 that the emission layer 220 is provided as one body over the first pixel electrode 210R, the second pixel electrode 210G, and the third pixel electrode 210B, the present disclosure is not limited thereto. The emission layer 220 may be disposed to correspond to each of the first pixel electrode 210R, the second pixel electrode 210G, and the third pixel electrode 210B. However, various suitable modifications may be made.

As described above, though the emission layer 220 may include a layer having one body over the first pixel electrode 210R, the second pixel electrode 210G, and the third pixel electrode 210B, the emission layer 220 may include a layer patterned to correspond to each of the first pixel electrode 210R, the second pixel electrode 210G, and the third pixel electrode 210B when needed. In any case, the emission layer 220 may be a first-color emission layer. The first-color emission layer may be one body over the first pixel electrode 210R, the second pixel electrode 210G, and the third pixel electrode 210B, or may be patterned to correspond to each of the first pixel electrode 210R, the second pixel electrode 210G, and the third pixel electrode 210B when needed. The first-color emission layer may be configured to emit light in a first wavelength band, for example, light in a wavelength band of about 450 nm to about 495 nm.

The opposite electrode 230 may be disposed on the emission layer 220 to correspond to the first pixel electrode 210R, the second pixel electrode 210G, and the third pixel electrode 210B. The opposite electrode 230 may be provided as one body over a plurality of organic light-emitting diodes. In one or more embodiments, the opposite electrode 230 may be a transparent electrode and may include a metal thin film including lithium (Li), calcium (Ca), LiF/Ca, LiF/Al, aluminum (Al), silver (Ag), magnesium (Mg), or compound thereof and having a small work function. In one or more embodiments, a transparent conductive oxide (TCO) such as ITO, IZO, ZnO, or $In_2O_3$ may be further disposed on the metal thin film.

In one or more embodiments, first light may be generated from a first emission area EA1 of the first organic light-emitting diode OLED1 and emitted to outside. The first emission area EA1 may be defined by a portion of the first pixel electrode 210R exposed by the opening of the pixel-defining layer 119. Second light may be generated from a second emission area EA2 of the second organic light-emitting diode OLED2 and emitted to outside. The second emission area EA2 may be defined by a portion of the second pixel electrode 210G exposed by the opening of the pixel-defining layer 119. Third light may be generated from a third emission area EA3 of the third organic light-emitting diode OLED3 and emitted to outside. The third emission area EA3 may be defined by a portion of the third pixel electrode 210B exposed by the opening of the pixel-defining layer 119.

The first emission area EA1, the second emission area EA2, and the third emission area EA3 may be apart from (e.g., be spaced from) one another. A region of the display area DA that is not the first emission area EA1, the second emission area EA2, and the third emission area EA3 may be a non-emission area. The first emission area EA1, the second emission area EA2, and the third emission area EA3 may be discriminated by the non-emission area. In a plan view, the first emission area EA1, the second emission area EA2, and the third emission area EA3 may be arranged in various suitable configurations such as a stripe configuration, an RGBG configuration such as a PENTILE® configuration (PENTILE® is a registered trademark of Samsung Display Co., Ltd., Republic of Korea), and/or the like. In a plan view, the shape of the first emission area EA1, the second emission area EA2, and the third emission area EA3 may be one of a polygonal shape, a circular shape, and an elliptical shape.

A spacer for preventing or substantially preventing mask chopping may be further disposed on the pixel-defining layer 119. The spacer may be provided as one body with the pixel-defining layer 119. As an example, the spacer and the pixel-defining layer 119 may be concurrently (e.g., simultaneously) formed during the same process that uses a half-tone mask process.

The encapsulation layer 300 may be disposed on the display element and may cover the display element. Because the first organic light-emitting diode OLED1, the second organic light-emitting diode OLED2, and the third organic light-emitting diode OLED3 may be easily damaged by external moisture or oxygen, the first organic light-emitting diode OLED1, the second organic light-emitting diode OLED2, and the third organic light-emitting diode OLED3 may be covered and protected by the encapsulation layer 300. The encapsulation layer 300 may cover the display area DA and extend to the outside of the display area DA. The encapsulation layer 300 may include at least one organic encapsulation layer and at least one inorganic encapsulation layer. As an example, the encapsulation layer 300 includes a first inorganic encapsulation layer 310, an organic encapsulation layer 320, and a second inorganic encapsulation layer.

Because the first inorganic encapsulation layer 310 extends along a structure thereunder, an upper surface thereof may not be flat. The organic encapsulation layer 320 may cover the first inorganic encapsulation layer 310 and, unlike the first inorganic encapsulation layer 310, an upper surface of the organic encapsulation layer 320 may be approximately flat.

The first inorganic encapsulation layer 310 and the second inorganic encapsulation layer 330 may each include at least one inorganic material among aluminum oxide ($Al_2O_3$), titanium oxide ($TiO_2$), tantalum oxide ($Ta_2O_5$), hafnium oxide ($HfO_2$), zinc oxide ($ZnO_x$), silicon oxide ($SiO_2$), silicon nitride ($SiN_x$), and silicon oxynitride (SiON). The organic encapsulation layer 320 may include a polymer-based material. The polymer-based material may include an acryl-based resin, an epoxy-based resin, polyimide, and/or polyethylene. In one or more embodiments, the organic encapsulation layer 320 may include acrylate.

Even when cracks occur inside the encapsulation layer 300, the encapsulation layer 300 may prevent or substantially prevent the cracks from being connected between the first inorganic encapsulation layer 310 and the organic encapsulation layer 320 or between the organic encapsulation layer 320 and the second inorganic encapsulation layer 330 through the above multi-layer structure. Through this, a path where external moisture or oxygen and/or the like penetrates to the display area DA may be prevented or reduced. In one or more embodiments, other layers such as a capping layer may be disposed between the first inorganic encapsulation layer 310 and the opposite electrode 230.

The color panel 20 may include the upper substrate 400, a color filter layer 500, a refractive layer RL, a first capping layer CL1, a bank 600, a functional layer 700, and a second capping layer CL2. The upper substrate 400 may be disposed over the lower substrate 100 with the light-emitting element therebetween. The upper substrate 400 may be disposed over the first organic light-emitting diode OLED1, the second organic light-emitting diode OLED2, and the third organic light-emitting diode OLED3.

The upper substrate 400 may include a central area CA overlapping the light-emitting element. In one or more embodiments, the central area CA may include a first central area CA1, a second central area CA2, and a third central area CA3. In a plan view, the first central area CA1 may overlap the first organic light-emitting diode OLED1 and/or the first emission area EA1. In a plan view, the second central area CA2 may overlap the second organic light-emitting diode OLED2 and/or the second emission area EA2. In a plan view, the third central area CA3 may overlap the third organic light-emitting diode OLED3 and/or the third emission area EA3.

The upper substrate 400 may include glass, metal, and/or a polymer resin. In the case where the upper substrate 400 is flexible or bendable, the upper substrate 400 may include, for example, a polymer resin including polyethersulphone, polyacrylate, polyetherimide, polyethylene naphthalate, polyethylene terephthalate, polyphenylene sulfide, polyarylate, polyimide, polycarbonate, and cellulose acetate propionate. In one or more embodiments, the upper substrate 400 may have a multi-layer structure including two layers and a barrier layer between the two layers. The two layers include the above polymer resins, and the barrier layer includes an inorganic material such as silicon oxide ($SiO_2$), silicon nitride ($SiN_x$), silicon oxynitride (SiON), and/or the like.

The color filter layer 500 may be disposed on the lower surface of the upper substrate 400 in a direction from the upper substrate 400 to the lower substrate 100. The color filter layer 500 may include a first color filter 510, a second color filter 520, and a third color filter 530. The first color filter 510 may be arranged in the first central area CA1. The second color filter 520 may be arranged in the second central area CA2. The third color filter 530 may be arranged in the third central area CA3. The first color filter 510, the second color filter 520, and the third color filter 530 may each include a photosensitive material. Each of the first color filter 510, the second color filter 520, and the third color filter 530 may include dye representing a unique color. The first color filter 510 may transmit only light in a wavelength band from about 630 nm to about 780 nm, the second color filter 520 may transmit only light in a wavelength band from about 495 nm to about 570 nm, and the third color filter 530 may transmit only light in a wavelength band from about 450 nm to about 495 nm.

The color filter layer 500 may reduce external light reflection of the display apparatus 1. As an example, when external light reaches the first color filter 510, only light in a wavelength band (e.g., a wavelength band set in advance) may pass through the first color filter 510 as described above, and light in the other wavelengths may be absorbed by the first color filter 510. Accordingly, among external light incident to the display apparatus 1, only light in the wavelength band (e.g., the wavelength band set in advance) may pass through the first color filter 510, and a portion of the light that passes through the first color filter 510 may be reflected by the opposite electrode 230 and/or the first pixel electrode 210R therebelow and emitted to outside. Because, among external light incident to where the first sub-pixel PX1 is located, only a portion of the external light is reflected, external light reflection may be reduced. This description is applicable to the second color filter 520 and the third color filter 530, and thus, repeated descriptions thereof may be omitted.

The first color filter 510, the second color filter 520, and the third color filter 530 may overlap each other. The first color filter 510, the second color filter 520, and the third color filter 530 may overlap each other between one of the central areas CA and another one of the central areas CA. As an example, the first color filter 510, the second color filter 520, and the third color filter 530 may overlap each other between the first central area CA1 and the second central area CA2. In this case, the third color filter 530 may be arranged between the first central area CA1 and the second central area CA2. The first color filter 510 may extend from the first central area CA1 to overlap the third color filter 530. The second color filter 520 may extend from the second central area CA2 to overlap the third color filter 530.

The first color filter 510, the second color filter 520, and the third color filter 530 may overlap each other (e.g., overlap each other in a thickness direction of the color filter layer 500) between the second central area CA2 and the third central area CA3. The first color filter 510 may be arranged between the second central area CA2 and the third central area CA3. The second color filter 520 may extend from the second central area CA2 to overlap the first color filter 510. The third color filter 530 may extend from the third central area CA3 to overlap the first color filter 510.

The first color filter 510, the second color filter 520, and the third color filter 530 may overlap each other between the third central area CA3 and the first central area CA1. The second color filter 520 may be arranged between the third central area CA3 and the first central area CA1. The third color filter 530 may extend from the third central area CA3 to overlap the second color filter 520. The first color filter 510 may extend from the first central area CA1 to overlap the second color filter 520.

The first color filter 510, the second color filter 520, and the third color filter 530 may overlap each other to constitute a light-blocking part BP. Accordingly, the color filter layer 500 may prevent or reduce color mixing even without a separate light-blocking member.

In one or more embodiments, the third color filter 530 may be stacked first on the upper substrate 400. This is because the third color filter 530 may absorb a portion of external light incident from the outside of the upper substrate 400 and thus reduce the reflectivity of the display apparatus 1, and light reflected by the third color filter 530 is nearly not viewed (e.g., barely noticeable) by a user.

The refractive layer RL may be arranged in the central area CA. The refractive layer RL may be arranged in the first central area CA1, the second central area CA2, and the third central area CA3. The refractive layer RL may include an organic material. In one or more embodiments, the refractive index of the refractive layer RL may be less than the refractive index of a first capping layer CL1. In one or more embodiments, the refractive index of the refractive layer RL may be less than the refractive index of the color filter layer 500. Accordingly, the refractive layer RL may condense light.

The first capping layer CL1 may be disposed on the refractive layer RL and the color filter layer 500. In one or more embodiments, the first capping layer CL1 may be disposed between the color filter layer 500 and the functional layer 700. The first capping layer CL1 may protect the refractive layer RL and the color filter layer 500. The first capping layer CL1 may prevent or reduce impurities such as external moisture and/or air penetrating to damage or contaminate the refractive layer RL and/or the color filter layer 500. The first capping layer CL1 may include an inorganic material.

The bank 600 may be disposed on the first capping layer CL1. In one or more embodiments, the bank 600 may be disposed on the upper substrate 400. For example, the bank 600 may be disposed on the upper substrate 400 with the first capping layer CL1 and/or the color filter layer 500 therebetween. In one or more embodiments, the bank 600 may be disposed on the lower surface of the upper substrate 400 facing the lower substrate 100. The bank 600 may include an organic material. Depending on the embodiment, the bank 600 may include a light-blocking material to serve as a light-blocking layer. The light-blocking material may include at least one of, for example, black pigment, black dye, black particles, or metal particles.

The bank 600 may include a plurality of openings. As an example, the bank 600 may include a central opening COP. The central opening COP may overlap the central area CA. In one or more embodiments, a plurality of central openings COP may overlap the central area CA. As an example, a first central opening COP1 may overlap the first central area CA1. A second central opening COP2 may overlap the second central area CA2. A third central opening COP3 may overlap the third central area CA3.

The functional layer 700 may be disposed in the central opening COP. The functional layer 700 may fill the central opening COP. In one or more embodiments, the functional layer 700 may include at least one of a color-converting material or scatterers. In one or more embodiments, the color-converting material may include quantum dots. In one or more embodiments, the functional layer 700 may include a first quantum-dot layer 710, a second quantum-dot layer 720, and a transmission layer 730.

The first quantum-dot layer 710 may be disposed in the first central opening COP1. The first quantum-dot layer 710 may overlap the first central area CA1. The first quantum-dot layer 710 may fill the first central opening COP1. The first quantum-dot layer 710 may overlap the first emission area EA1. The first sub-pixel PX1 may include the first organic light-emitting diode OLED1 and the first quantum-dot layer 710.

The first quantum-dot layer 710 may convert light in a first wavelength band generated from the emission layer 220 on the first pixel electrode 210R into light in a second wavelength band. As an example, when light in a wavelength band of about 450 nm to about 495 nm is generated from the emission layer 220 on the first pixel electrode 210R, the first quantum-dot layer 710 may convert the light into light in a wavelength band of about 630 nm to about 780 nm. Accordingly, from the first sub-pixel PX1, light in a wavelength band of about 630 nm to about 780 nm may be emitted to outside through the upper substrate 400. In one or more embodiments, the first quantum-dot layer 710 may include first quantum dots QD1, first scatterers SC1, and a first base resin BR1. The first quantum dots QD1 and the first scatterers SC1 may be dispersed inside the first base resin BR1.

The second quantum-dot layer 720 may be disposed in the second central opening COP2. The second quantum-dot layer 720 may overlap the second central area CA2. The second quantum-dot layer 720 may fill the second central opening COP2. The second quantum-dot layer 720 may overlap the second emission area EA2. The second sub-pixel PX2 may include the second organic light-emitting diode OLED2 and the second quantum-dot layer 720.

The second quantum-dot layer 720 may convert light in a first wavelength band generated from the emission layer 220 on the second pixel electrode 210G into light in a third wavelength band. As an example, when light in a wavelength band of about 450 nm to about 495 nm is generated from the emission layer 220 on the second pixel electrode 210G, the second quantum-dot layer 720 may convert the light into light in a wavelength band of about 495 nm to about 570 nm. Accordingly, from the second sub-pixel PX2, light in a wavelength band of about 495 nm to about 570 nm may be emitted to outside through the upper substrate 400. In one or more embodiments, the second quantum-dot layer 720 may include second quantum dots QD2, second scatterers SC2, and a second base resin BR2. The second quantum dots QD2 and the second scatterers SC2 may be dispersed inside the second base resin BR2.

The transmission layer 730 may be disposed in the third central opening COP3. The transmission layer 730 may overlap the third central area CA3. The transmission layer 730 may fill the third central opening COP3. The transmission layer 730 may overlap the third emission area EA3. The third sub-pixel PX3 may include the third organic light-emitting diode OLED3 and the transmission layer 730.

The transmission layer 730 may emit light generated from the emission layer 220 on the third pixel electrode 210B to outside without wavelength conversion (e.g., without wavelength conversion using quantum dots). As an example, when light in a wavelength band of about 450 nm to about 495 nm is generated from the emission layer 220 on the third pixel electrode 210B, the transmission layer 730 may emit the light without wavelength conversion. In one or more embodiments, the transmission layer 730 may include third scatterers SC3 and a third base resin BR3. The third scatterers SC3 may be dispersed in the third base resin BR3. In one or more embodiments, the transmission layer 730 may not include quantum dots.

At least one of the first quantum dots QD1 and the second quantum dots QD2 may include a semiconductor material such as cadmium sulfide (CdS), cadmium telluride (CdTe), zinc sulfide (ZnS), indium phosphide (InP) and/or the like. The size of the quantum dot may be several nanometers, and the wavelength of light after conversion may be changed depending on the size of the quantum dot.

In one or more embodiments, the core of the quantum dot may be one of a Group II-Group VI compound, a Group III-Group V compound, a Group IV-Group VI compound, a Group IV element, a Group IV compound, and a combination thereof.

A group II-VI compound may include one of a two-element compound including one of CdSe, CdTe, ZnS, ZnSe, ZnTe, ZnO, HgS, HgSe, HgTe, MgSe, MgS, and a mixture thereof; a three-element compound including one of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound including one of HgZnTeS, CdZnSeS, CdZn-SeTe, CdZnSTe, CdHgSeS, CdHgSeTe, CdHgSTe, HgZnSeS, HgZnSeTe, HgZnSTe, and a mixture thereof.

A group III-V compound may include one of a two-element compound including one of GaN, GaP, GaAs, GaSb, AlN, AlP, AlAs, AlSb, InN, InP, InAs, InSb, and a mixture thereof; a three-element compound including one of GaNP, GaNAs, GaNSb, GaPAs, GaPSb, AlNP, AlNAs, AlNSb, AlPAs, AlPSb, InGaP, InNP, InNAs, InNSb, InPAs, InPSb, and a mixture thereof; and a four-element compound including one of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

A group IV-VI compound may include one of a two-element compound including one of SnS, SnSe, SnTe, PbS, PbSe, PbTe, and a mixture thereof; a three-element compound including one of SnSeS, SnSeTe, SnSTe, PbSeS, PbSeTe, PbSTe, SnPbS, SnPbSe, SnPbTe, and a mixture thereof; and a four-element compound including one of SnPbSSe, SnPbSeTe, SnPbSTe, and a mixture thereof. A group IV element may include one of Si, Ge, and a mixture thereof. A group IV compound may include a two-element compound including one of SiC, SiGe, and a mixture thereof.

In this case, the two-element compound, the three-element compound, or the four-element compound may be present inside a particle at a uniform concentration, or may be divided into states with partially different concentration distributions and present in the same particle. In one or more embodiments, a core-shell structure in which one quantum dot surrounds another quantum dot may be provided. An interface between the core and the shell may have a concentration gradient in which the concentration of an element existing in the shell decreases toward the center.

In one or more embodiments, a quantum dot may have a core-shell structure including a core and a shell, the core including a nano crystal, and the shell around (e.g., surrounding) the core. The shell of a quantum dot may serve as a protective layer that prevents a chemical change of the core to maintain a semiconductor characteristic and/or serve as a charging layer for giving an electrophoretic characteristic to the quantum dot. The shell may include a single layer or a multi-layer. An interface between the core and the shell may have a concentration gradient in which the concentration of an element existing in the shell decreases toward the center. Examples of the shell of the quantum dot include oxide of metal or non-metal, a semiconductor compound, or a combination thereof.

As an example, though the oxide of metal or non-metal may include a two-element compounding including $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $CO_3O_4$, NiO, or a three-element compound including $MgAl_2O_4$, $CoFe_2O_4$, $NiFe_2O_4$, and $CoMn_2O_4$, the oxide of metal or non-metal is not limited thereto.

Though the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb, the semiconductor compound is not limited thereto.

A quantum dot may have a full width of half maximum (FWHM) of a light emission wavelength spectrum of 45 nm or less, about 40 nm or less, and about 30 nm or less. Within this range, color purity or color reproduction may be improved. In one or more embodiments, because light emitted from the quantum dot is emitted in all directions, a viewing angle of light may be improved.

In addition, the shape of the quantum dot is a shape generally used in the art but is not particularly limited thereto. For example, the shape of the quantum dot may include cubic nano particles, nano tubes, nano wires, and/or nano fibers having a spherical shape, a pyramid shape, a multi-arm shape, or a nano plate shape.

The quantum dot may be configured to adjust a color of light emitted depending on a size thereof, and thus, the quantum dot may have various suitable emission colors such as a blue color, a red color, a green color, and/or the like.

The first scatterers SC1, the second scatterers SC2, and the third scatterers SC3 may allow more light to be emitted by scattering light. The first scatterers SC1, the second scatterers SC2, and the third scatterers SC3 may increase a light-emission efficiency. For at least one of the first scatterers SC1, the second scatterers SC2, or the third scatterers SC3, any material such as metal or metal oxide for uniformly scattering light may be used. As an example, at least one of the first scatterers SC1, the second scatterers SC2, or the third scatterers SC3 may include at least one of $TiO_2$, $ZrO_2$, $Al_2O_3$, $In_2O_3$, ZnO, $SnO_2$, $Sb_2O_3$, or ITO. In one or more embodiments, at least one of the first scatterers SC1, the second scatterers SC2, or the third scatterers SC3 may have a refractive index of 1.5 or more. Accordingly, a light-emission efficiency of the functional layer 700 may improve. In one or more embodiments, at least one of the first scatterers SC1, the second scatterers SC2, or the third scatterers SC3 may not be provided.

The first base resin BR1, the second base resin BR2, and the third base resin BR3 may include a light-transmissive material. As an example, at least one of the first base resin BR1, the second base resin BR2, or the third base resin BR3 may include a polymer resin such as acrylic, benzocyclobutene (BCB), or hexamethyldisiloxane (HMDSO).

The second capping layer CL2 may be disposed on the bank 600 and the functional layer 700. The second capping layer CL2 may protect the bank 600 and the functional layer 700. The second capping layer CL2 may prevent or reduce impurities such as external moisture and/or air penetrating to damage or contaminate the bank 600 and/or the functional layer 700. The second capping layer CL2 may include an inorganic material.

In the display apparatus 1, light in the second wavelength band may be emitted to outside from the first sub-pixel PX1, light in the third wavelength band may be emitted to outside from the second sub-pixel PX2, and light in the first wavelength band is emitted to outside from the third sub-pixel PX3. For example, the display apparatus 1 may display full-color images.

The filling layer 30 may be disposed between the light-emitting panel 10 and the color panel 20. In one or more embodiments, the filling layer 30 may be disposed between the encapsulation layer 300 and the bank 600. The filling layer 30 may perform a buffering function against external pressure and/or the like. The filling layer 30 may include a filler. In one or more embodiments, the filling layer 30 may include a thermosetting filler or a photocurable filler. The filler may include an organic materials such as methyl silicone, a phenyl silicone, polyimide and/or the like. However, the filler is not limited thereto and may include an organic sealant such as a urethane-based resin, an epoxy-based resin, an acryl-based resin, an inorganic sealant, and/or silicones.

One of the light-emitting panel 10 and the color panel 20 may include a column spacer 800. In one or more embodiments, the color panel 20 may include the column spacer 800. In another embodiment, the light-emitting panel 10 may include the column spacer 800. Hereinafter, the case where the color panel 20 includes the column spacer 800 is described in more detail. The column spacer 800 may be disposed on the bank 600 and may face the lower substrate 100. In one or more embodiments, the column spacer 800 may be disposed on the bank 600 with the second capping layer CL2 therebetween. The column spacer 800 may separate the encapsulation layer 300 from the bank 600. The column spacer 800 may pass through the filling layer 30. The column spacer 800 may include an organic material. In one or more embodiments, the column spacer 800 may include an acryl-based material.

The column spacer 800 may separate the light-emitting element from the functional layer 700 with a uniform interval. Accordingly, the filling layer 30 may be arranged in the display area DA with a uniform thickness. In other words, a separation distance between the first organic light-emitting diode OLED1 and the first quantum-dot layer 710 may be substantially the same as a separation distance between the second organic light-emitting diode OLED2 and the second quantum-dot layer 720. In one or more embodiments, a separation distance between the second organic light-emitting diode OLED2 and the second quantum-dot layer 720 may be substantially the same as a separation distance between the third organic light-emitting diode OLED3 and the transmission layer 730. Unlike the present embodiment, in the case where the column spacer 800 is omitted, the plurality of light-emitting elements and the functional layer may not maintain a uniform interval. As an example, the thickness of the filling layer 30 in the first central area CA1 may be different from the thickness of the filling layer 30 in the second central area CA2. In this case, the brightness of light emitted from the first organic light-emitting diode OLED1 and passing through the filling layer 30 that overlaps the first central area CA1 may be different from the brightness of light emitted from the second organic light-emitting diode OLED2 and passing through the filling layer 30 that overlaps the second central area CA2. In the present embodiment, the column spacer 800 may be disposed to pass through the filling layer 30 to separate the light-emitting element from the functional layer 700 with a uniform interval. In one or more embodiments, a phenomenon that brightness changes depending on location in the display area DA may be prevented or reduced due to the filling layer 30.

Figure 4:
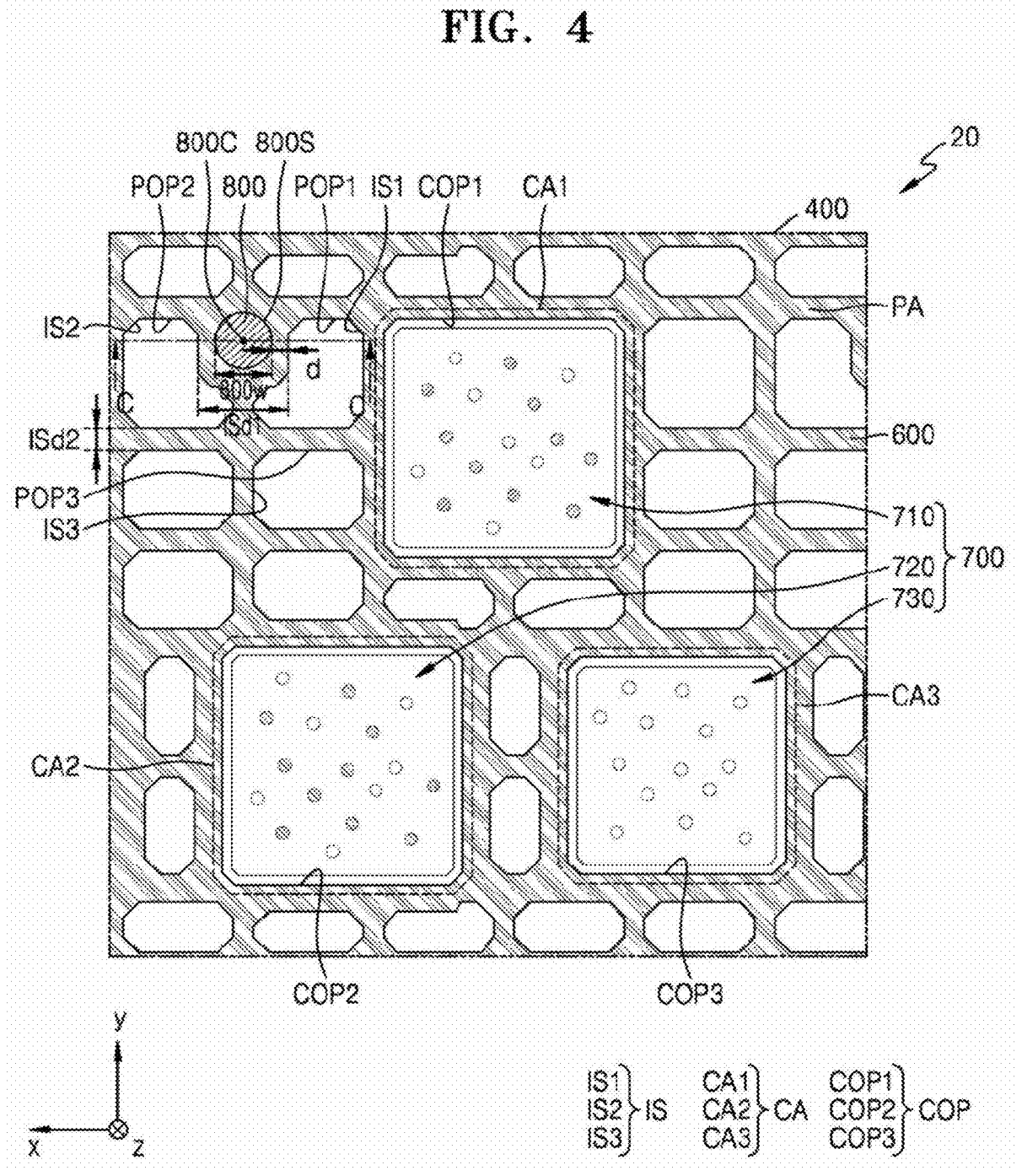
FIG. 4 is a plan view of a portion of a color panel according to one or more embodiments.

FIG. 4 is a plan view of a portion of the color panel 20 according to one or more embodiments. FIG. 4 is an enlarged plan view of the color panel 20 corresponding to a region B of the display apparatus 1 of FIG. 1.

Referring to FIG. 4, the color panel 20 may include the upper substrate 400, the bank 600, the functional layer 700, and the column spacer 800. The upper substrate 400 may include the central area CA and the peripheral area PA. The central area CA may be a region in which the functional layer 700 is arranged. The peripheral area PA may be a light-blocking area. In one or more embodiments, the central area CA may include the first central area CA1, the second central area CA2, and the third central area CA3. The first central area CA1, the second central area CA2, and the third central area CA3 may be apart from (e.g., be spaced from) each other. Though it is shown that the center of the first central area CA1, the center of the second central area CA2, and the center of the third central area CA3 are arranged to form vertexes of a virtual triangle, the first central area CA1, the second central area CA2, and the third central area CA3 may be arranged side by side in a first direction (e.g., an x direction) and/or a second direction (e.g., a y direction) in another embodiment.

The peripheral area PA may be arranged outside the central area CA. The peripheral area PA may be around (e.g., may surround) at least a portion of the central area CA. In one or more embodiments, the peripheral area PA may surround the central area CA entirely. The peripheral area PA may surround the first central area CA1. The peripheral area PA may surround the second central area CA2. The peripheral area PA may surround the third central area CA3.

The bank 600 may include the central opening COP and a peripheral opening POP. In one or more embodiments, the area of the central opening COP may be greater than the area of the peripheral opening POP. The central opening COP may overlap the central area CA. The functional layer 700 may fill the central opening COP. The central opening COP may include the first central opening COP1, the second central opening COP2, and the third central opening COP3. The first central opening COP1 may be arranged in the first central opening CA1. The second central opening COP2 may be arranged in the second central opening CA2. The third central opening COP3 may be arranged in the third central opening CA3.

The peripheral opening POP may be arranged in the peripheral area PA. The peripheral opening POP may include a plurality of peripheral openings POP. The shape of the plurality of peripheral openings POP may be various suitable shapes such as a polygonal shape or a circular shape. In one or more embodiments, the plurality of peripheral openings POP may surround the central opening COP in a plan view. As an example, the plurality of peripheral openings POP may surround the first central opening COP1 in a plan view. The plurality of peripheral openings POP may surround the second central opening COP2 in a plan view. The plurality of peripheral openings POP may surround the third central opening COP3 in a plan view.

The peripheral opening POP may be a structure for increasing the reliability of the color panel 20. As an example, the functional layer 700 may be formed by an inkjet printing process. In the case of forming the functional layer 700 by discharging ink to the central opening COP, accurate alignment between an inkjet outlet and the central opening COP may be required. When the accurate alignment between the inkjet outlet and the central opening COP is not made, the functional layer 700 may be formed on the upper surface of the bank 600. In this case, the functional layer 700 formed on the upper surface of the bank 600 may cause damage such as cracks to the encapsulation layer while the color panel 20 is attached to the light-emitting panel. In one or more embodiments, due to the functional layer 700 formed on the upper surface of the bank 600, the filling layer may not be disposed uniformly between the light-emitting panel and the color panel 20. In the present embodiment, because the plurality of peripheral openings POP surround the central opening COP in a plan view, forming of the functional layer 700 on the upper surface of the bank 600 may be prevented or reduced. Even though ink is discharged to the upper surface of the bank 600, the ink may flow to the inside of the peripheral opening POP. Accordingly, the peripheral opening POP may prevent or reduce damage to the encapsulation layer, and the filling layer may have a uniform thickness.

In one or more embodiments, the peripheral opening POP may include a first peripheral opening POP1, a second peripheral opening POP2, and a third peripheral opening POP3. The first peripheral opening POP1 may be adjacent to the second peripheral opening POP2. The first peripheral opening POP1 may be adjacent to the third peripheral opening POP3. The first peripheral opening POP1 may be defined by a first inner surface IS1 of the bank 600. The second peripheral opening POP2 may be defined by a second inner surface IS2 of the bank 600. The third peripheral opening POP3 may be defined by a third inner surface IS3 of the bank 600.

In one or more embodiments, the column spacer 800 may be disposed between the first peripheral opening POP1 and the second peripheral opening POP2. As shown in FIG. 4, the column spacer 800 may be disposed between the first peripheral opening POP1 and the second peripheral opening POP2 in the first direction (e.g., the x direction). In one or more embodiments, a first distance ISd1 (e.g., a distance in the first direction) between the first inner surface IS1 and the second inner surface IS2 may be equal to or greater than a sum of a width 800w (e.g., a width in the first direction) of the column spacer 800 and may be about 30 μm. The first distance ISd1 may be the length of a virtual line segment that overlaps a center 800C of the column spacer 800 and connects the first inner surface IS1 to the second inner surface IS2. In one or more embodiments, the virtual line segment that overlaps a center 800C of the column spacer 800 may be perpendicular to the first inner surface IS1 and the second inner surface IS2 in a plan view.

In one or more embodiments, a second distance ISd2 (e.g., a distance in the second direction) between the second inner surface IS2 and the third inner surface IS3 may be 30 μm or less. In one or more embodiments, the second distance ISd2 may be in a range of about 14 μm to about 22 μm. The first distance ISd1 may be greater than the second distance ISd2. In other words, the width of a region of the bank 600 in which the column spacer 800 is disposed may be greater than the width of a region of the bank 600 in which column spacer 800 is not disposed. Accordingly, the area of the peripheral opening POP may be secured, and the forming of the functional layer 700 on the upper surface of the bank 600 may be prevented or reduced.

The functional layer 700 may be disposed in the central opening COP. The functional layer 700 may fill the central opening COP. In one or more embodiments, the functional layer 700 may include at least one of a color-converting material or scatterers. In one or more embodiments, the color-converting material may include quantum dots. In one or more embodiments, the functional layer 700 may include the first quantum-dot layer 710, the second quantum-dot layer 720, and the transmission layer 730. The first quantum-dot layer 710 may be disposed in the first central opening COP1. The second quantum-dot layer 720 may be disposed in the second central opening COP2. The transmission layer 730 may be disposed in the third central opening COP3.

The column spacer 800 may be disposed on the bank 600. In one or more embodiments, the column spacer 800 may be arranged in the peripheral area PA. In a plan view, the column spacer 800 may be surrounded by the plurality of peripheral openings POP. In one or more embodiments, the peripheral opening POP may be arranged between the column spacer 800 and the central opening COP in a plan view. Accordingly, while the column spacer 800 is formed, remnants of the material forming the column spacer 800 in the central opening COP may be prevented or reduced.

The column spacer 800 may have an outer surface 800S of the column spacer 800 in a plan view. The outer surface 800S of the column spacer 800 may define the shape of the column spacer 800 in a plan view. Though it is shown in FIG. 4 that the column spacer 800 has a circular shape, the column spacer 800 may have a polygonal shape in another embodiment.

In a plan view, a distance d from the outer surface 800S of the column spacer 800 to the inner surface IS of the bank 600 defining the peripheral opening POP may be 15 μm or more. The distanced is the length (e.g., length in the first direction) of a line segment extending from the outer surface 800S of the column spacer 800 to the inner surface IS of the bank 600. The line segment may be a portion of a line segment extending from the center 800C of the column spacer 800 to the inner surface IS of the bank 600.

A difference between the first distance ISd1 and the width 800w of the column spacer 800 may be 30 μm or more. The first distance ISd1 is a distance between the first inner surface IS1 and the second inner surface IS2. The width 800w of the column spacer 800 may be the length of a virtual line segment connecting two opposite portions of the outer surface 800S of the column spacer 800. The virtual line segment may pass through the center 800C of the column spacer 800. In one or more embodiments, the width 800w of the column spacer 800 may be about 20 μm. 15 μm may be a value that takes into account a process margin when forming the column spacer 800. The plurality of peripheral openings POP may be arranged around a region the column spacer 800 is formed, and the area of the bank 600 in which the column spacer 800 is arranged may not be sufficient. In this case, while the column spacer 800 is formed, the column spacer 800 may not have a shape set in advance. In contrast, according to the present embodiment, in a plan view, because the distance d from the outer surface 800S of the column spacer 800 to the inner surface IS of the bank 600 defining the peripheral opening POP is 15 μm or more, the area of the bank 600 in which the column spacer 800 is arranged may be sufficient, and a phenomenon that the column spacer 800 is lost may be prevented or reduced.

In one or more embodiments, in a plan view, the distance d from the outer surface 800S of the column spacer 800 to the inner surface IS of the bank 600 defining the peripheral opening POP may be in a range of about 15 μm to about 16 μm. Accordingly, the area of the peripheral openings POP arranged around the column spacer 800 may be sufficiently secured, and the forming of the functional layer 700 on the upper surface of the bank 600 may be prevented or reduced.

In one or more embodiments, the column spacer 800 may be provided in plurality on the bank 600. In other words, the plurality of column spacers 800 may be disposed on the bank 600. The plurality of column spacers 800 may be apart from (e.g., be spaced from) each other. In one or more embodiments, the distance d in one of the plurality of column spacers 800 may be less than 15 μm due to a process margin. However, because the plurality of column spacers 800 each are disposed on the bank 600 having a sufficient area, a phenomenon that the column spacer 800 is lost may be prevented or reduced.

Figure 5:
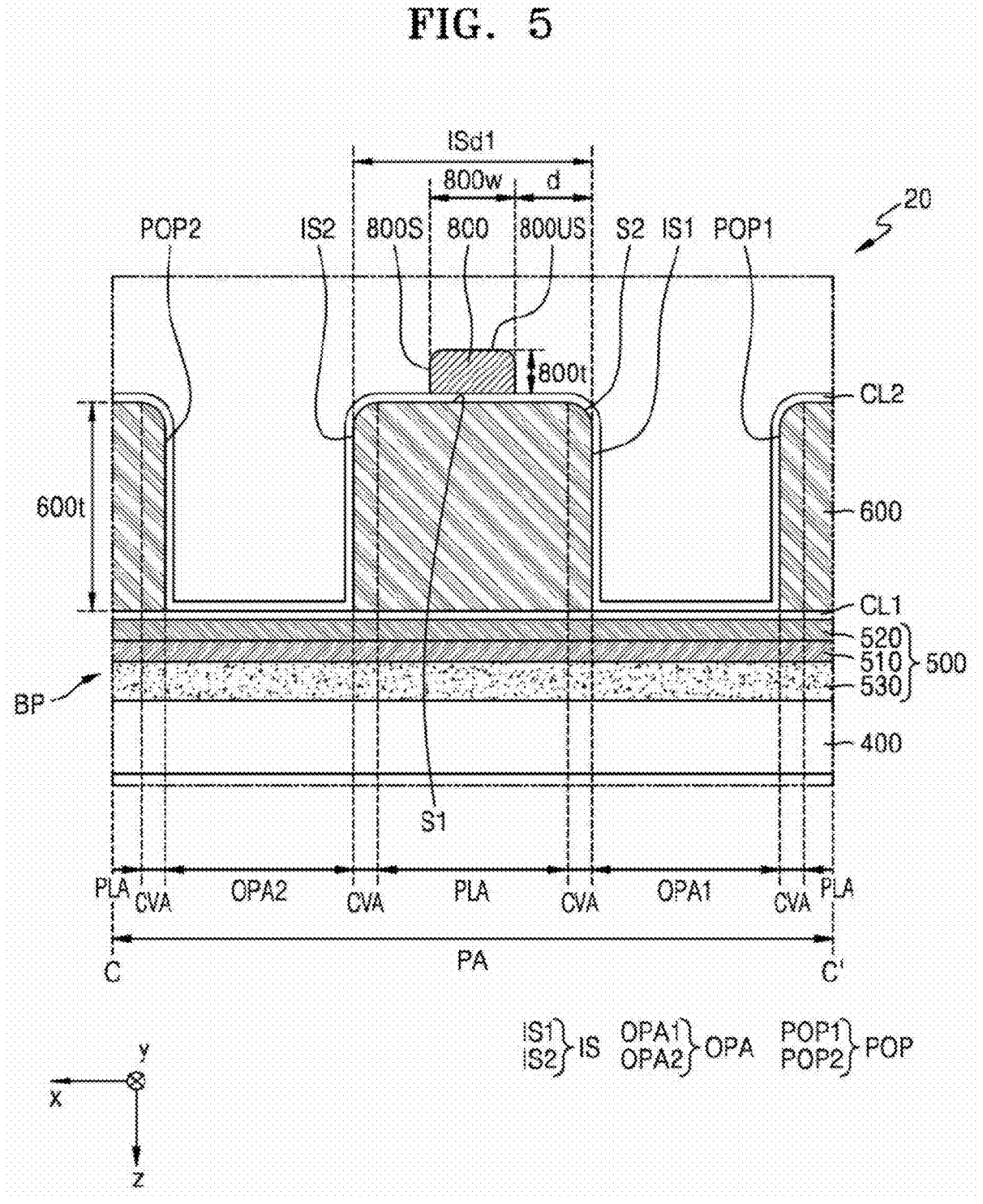
FIG. 5 is a cross-sectional view of the color panel of FIG. 4, taken along the line C-C' in FIG. 4.

FIG. 5 is a cross-sectional view of the color panel 20 of FIG. 4, taken along the line C-C'. In FIG. 5, the same reference numerals as those of FIG. 4 denote the same members, and thus, repeated descriptions thereof may be omitted.

Referring to FIG. 5, the color panel 20 may include the upper substrate 400, the color filter layer 500, the first capping layer CL1, the bank 600, the second capping layer CL2, and the column spacer 800. The upper substrate 400 may include the peripheral area PA.

The color filter layer 500 may be disposed on the upper substrate 400. In one or more embodiments, the color filter layer 500 may be disposed between the upper substrate 400 and the bank 600. The color filter layer 500 may include the first color filter 510, the second color filter 520, and the third color filter 530 respectively transmitting light in different wavelength bands. In one or more embodiments, the third color filter 530 may be disposed on the upper substrate 400. The first color filter 510 may be disposed on the third color filter 530. The second color filter 520 may be disposed on the first color filter 510. The first color filter 510, the second color filter 520, and the third color filter 530 may overlap each other to constitute the light-blocking part BP. Accordingly, the color filter layer 500 may prevent or reduce light passing through the peripheral area PA even without a separate light-blocking member.

The first capping layer CL1 may be disposed on the color filter layer 500, and the bank 600 may be disposed on the first capping layer CL1. In one or more embodiments, a thickness 600$t$ of the bank 600 may be 5 μm or more. In one or more embodiments, the thickness 600$t$ of the bank 600 may be in a range of about 10 μm to about 12 μm. The bank 600 may include the peripheral opening POP. The peripheral opening POP may overlap the light-blocking part BP. Accordingly, even though the bank 600 includes the peripheral opening POP, light may not pass through the peripheral area PA. The peripheral opening POP may include the first peripheral opening POP1 and the second peripheral opening POP2. The first peripheral opening POP1 may be defined by the first inner surface IS1 of the bank 600. The second peripheral opening POP2 may be defined by the second inner surface IS2 of the bank 600. In one or more embodiments, the first distance ISd1 between the first inner surface IS1 and the second inner surface IS2 may be equal to or greater than a sum of a width 800$w$ of the column spacer 800 and may be about 30 μm.

The bank 600 may include a planarization area PLA, an opening area OPA, and a curved area CVA. The planarization area PLA may include a first surface S1 that is flat. The planarization area PLA may not overlap the peripheral opening POP. The opening area OPA may overlap the peripheral opening POP. In other words, the opening area OPA may be a region in which the bank 600 is not arranged. In one or more embodiments, the opening area OPA may include a first opening area OPA1 and a second opening area OPA2. The first opening area OPA1 may overlap the first peripheral opening POP1. The second opening area OPA2 may overlap the second peripheral opening POP2. The curved area CVA may be arranged between the planarization area PLA and the opening area OPA. The curved area CVA may have a second surface S2 that is curved. The second surface S2 that is curved may be connected to the first surface S1 that is flat. In one or more embodiments, the bank 600 may include an organic material and be formed by exposing a coated organic material and then developing and hardening the same. In this case, the second surface S2 of the bank 600 may be formed in a round shape in the curved area CVA adjacent to the opening area OPA. Accordingly, the second surface S2 may have a curve.

The second capping layer CL2 may be disposed on the bank 600 and the first capping layer CL1. The second capping layer CL2 may cover the bank 600.

The column spacer 800 may be disposed on the bank 600. In one or more embodiments, the column spacer 800 may be disposed on the second capping layer CL2. The column spacer 800 may be disposed on the first surface S1. In the case where the column spacer 800 is disposed on the second surface S2, the column spacer 800 may not have a shape or a thickness set in advance. In this case, the function of the column spacer 800 may not be performed. In the present embodiment, because the column spacer 800 is disposed on the first surface S1 that is flat, the column spacer 800 may have the shape or thickness set in advance, and the thickness of the filling layer may be maintained constant regardless of position.

In one or more embodiments, the thickness 800$t$ of the column spacer 800 may be about 2.5 μm. In another embodiment, the thickness 800$t$ of the column spacer 800 may be less or greater than 2.5 μm.

The column spacer 800 may have the outer surface 800S of the column spacer 800 in a plan view. In a plan view, the distance d from the outer surface 800S of the column spacer 800 to the inner surface IS of the bank 600 defining the peripheral opening POP may be 15 μm or more. A difference between the first distance ISd1 and the width 800$w$ of the column spacer 800 may be 30 μm or more, where the first distance ISd1 is a distance between the first inner surface IS1 and the second inner surface IS2. Accordingly, the area of the bank 600 on which the column spacer 800 is disposed may be sufficient. In this case, an upper surface 800US of the column spacer 800 may be substantially flat or may have a small curvature. In one or more embodiments, the phenomenon that the column spacer 800 is lost may be prevented or reduced.

In one or more embodiments, in a plan view, the distance d from the outer surface 800S of the column spacer 800 to the inner surface IS of the bank 600 defining the peripheral opening POP may be in a range of about 15 μm to about 16 μm. Accordingly, the area of the peripheral openings POP arranged around the column spacer 800 may be sufficiently secured, and the forming of the functional layer 700 on the upper surface of the bank 600 may be prevented or reduced.

Figure 6A:
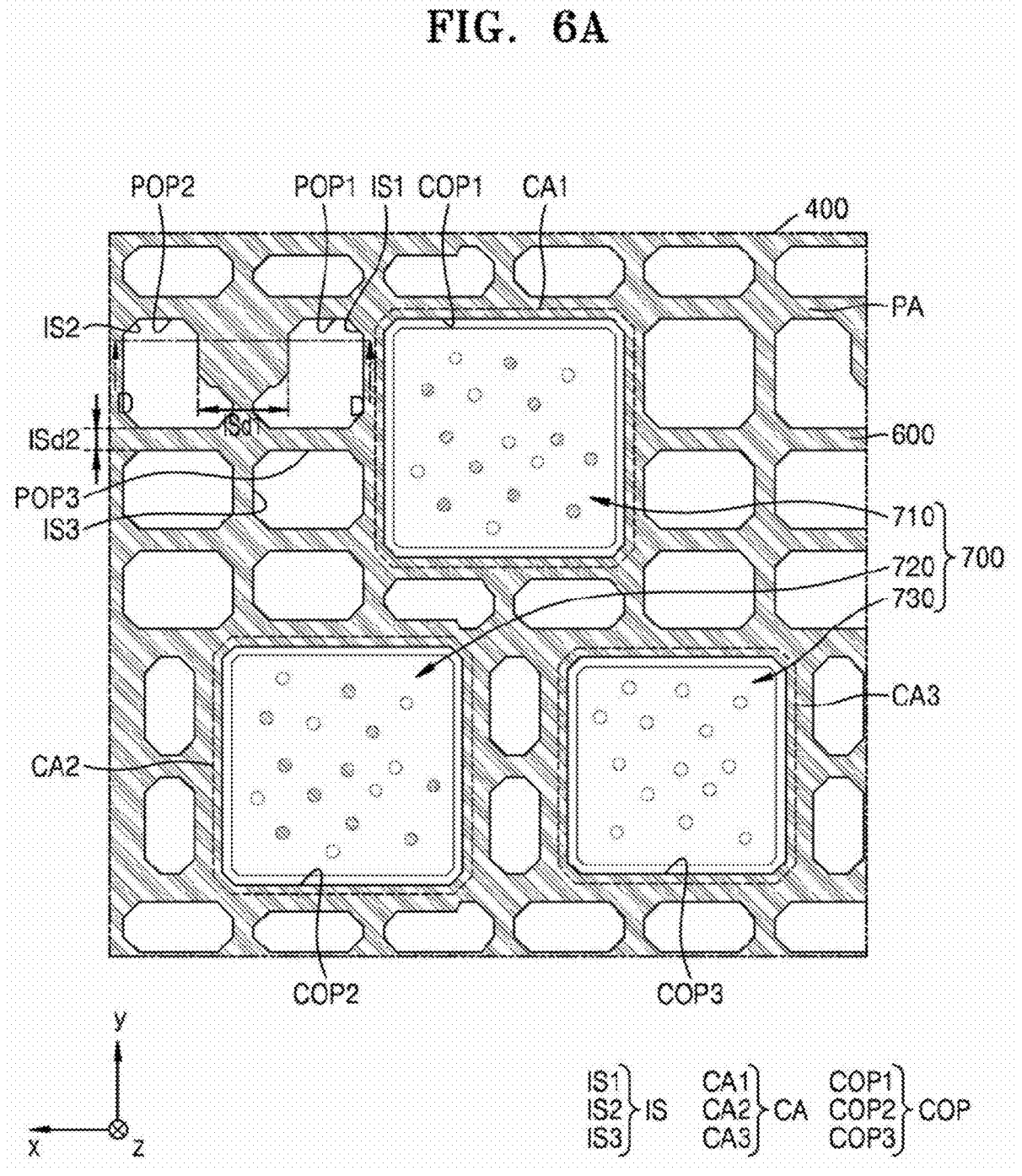
FIG. 6A is a plan view showing a method of manufacturing a display apparatus according to one or more embodiments.

FIG. 6A is a plan view showing a method of manufacturing a display apparatus according to one or more embodiments. FIGS. 6B to 6F are cross-sectional views showing a method of manufacturing a display apparatus according to one or more embodiments. FIGS. 6B to 6E are cross-sectional views of the bank 600 of FIG. 6A, taken along the line D-D'. In FIGS. 6A to 6F, the same reference numerals as those of FIGS. 3 to 5 denote the same members, and thus, repeated descriptions thereof may be omitted.

Figure 6B:
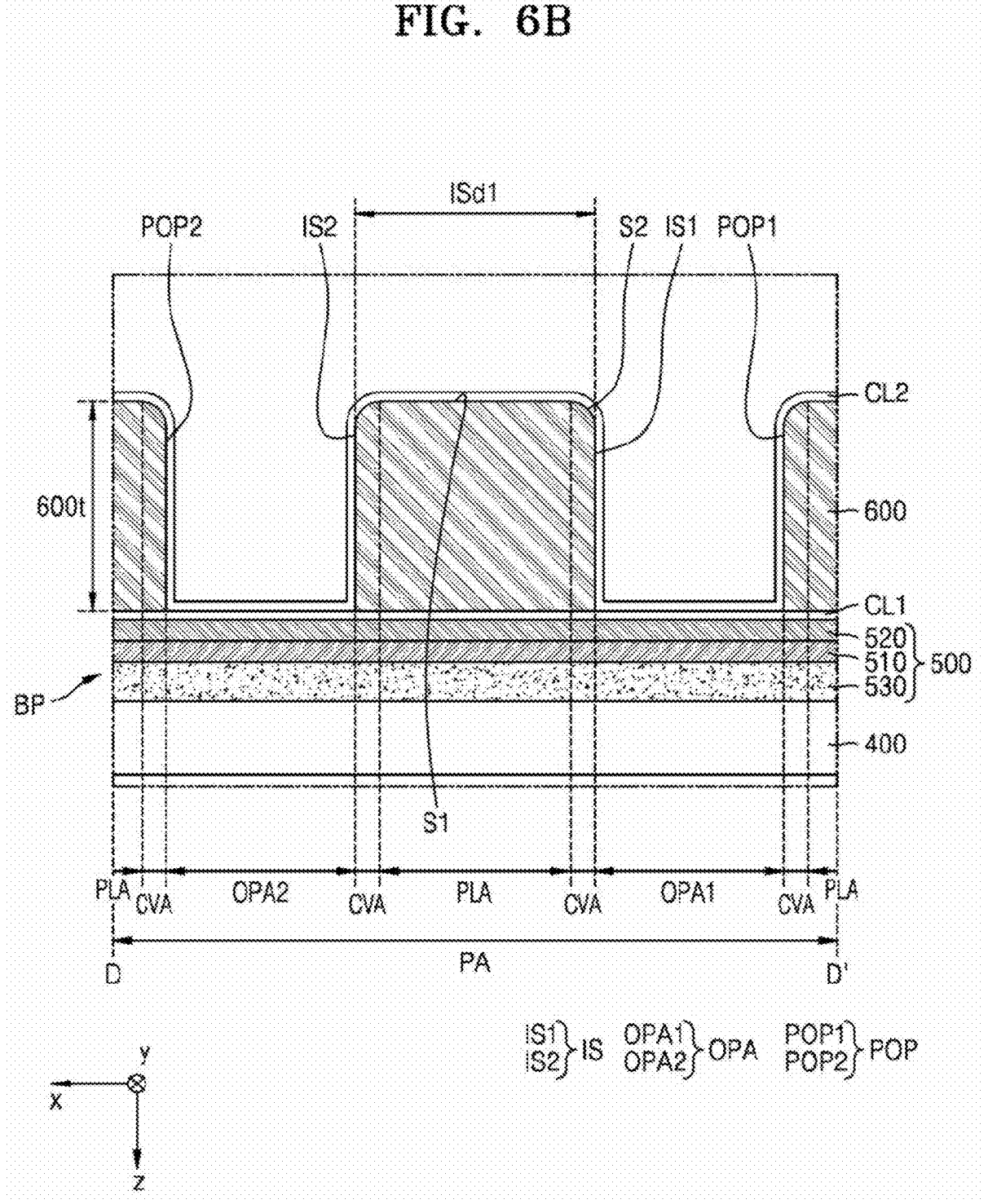
FIGS. 6B to 6F are cross-sectional views showing a method of manufacturing a display apparatus according to one or more embodiments.

Referring to FIGS. 6A and 6B, in the color panel being manufactured, the color filter layer 500 may be disposed on the upper substrate 400. The color filter layer 500 may include the first color filter 510, the second color filter 520, and the third color filter 530 respectively transmitting light in different wavelength bands. The first color filter 510, the second color filter 520, and the third color filter 530 may overlap each other (e.g., overlap each other in the thickness direction of the color filter layer 500) to constitute the light-blocking part BP. Accordingly, the color filter layer 500 may prevent or reduce light passing through the peripheral area PA even without a separate light-blocking member. The first capping layer CL1 may be disposed on the color filter layer 500.

The bank 600 may be disposed on the first capping layer CL1. In one or more embodiments, the thickness 600$t$ of the bank 600 may be 5 μm or more. In one or more embodiments, the thickness 600$t$ of the bank 600 may be in a range of about 10 μm to about 12 μm. In one or more embodiments, the bank 600 including the peripheral opening POP may be disposed on the upper substrate 400. In one or more embodiments, the peripheral opening POP may include the first peripheral opening POP1, the second peripheral opening POP2, and the third peripheral opening POP3. The first peripheral opening POP1 may be adjacent to the second peripheral opening POP2. The first peripheral opening POP1 may be adjacent to the third peripheral opening POP3. The first peripheral opening POP1 may be defined by the first inner surface IS1 of the bank 600. The second peripheral opening POP2 may be defined by the second inner surface IS2 of the bank 600. The third peripheral opening POP3 may be defined by a third inner surface IS3 of the bank 600.

In one or more embodiments, the second distance ISd2 between the second inner surface IS2 and the third inner surface IS3 may be 30 μm or less. In one or more embodiments, the second distance ISd2 may be in a range of about 14 μm to about 22 μm. The first distance ISd1 may be greater than the second distance ISd2.

The bank 600 may be formed by disposing an organic material on the first capping layer CL1 first, and then exposing, developing, and hardening the same. Accordingly, the bank 600 may include a planarization area PLA, an opening area OPA, and a curved area CVA. The planarization area PLA may include the first surface S1 that is flat. The opening area OPA may overlap the peripheral opening POP. The curved area CVA may be arranged between the planarization area PLA and the opening area OPA. The curved area CVA may have the second surface S2 that is curved. The second surface S2 that is curved may be connected to the first surface S1 that is flat.

The second capping layer CL2 may be disposed on the bank 600 and the first capping layer CL1. The second capping layer CL2 may cover the bank 600.

Figure 6C:
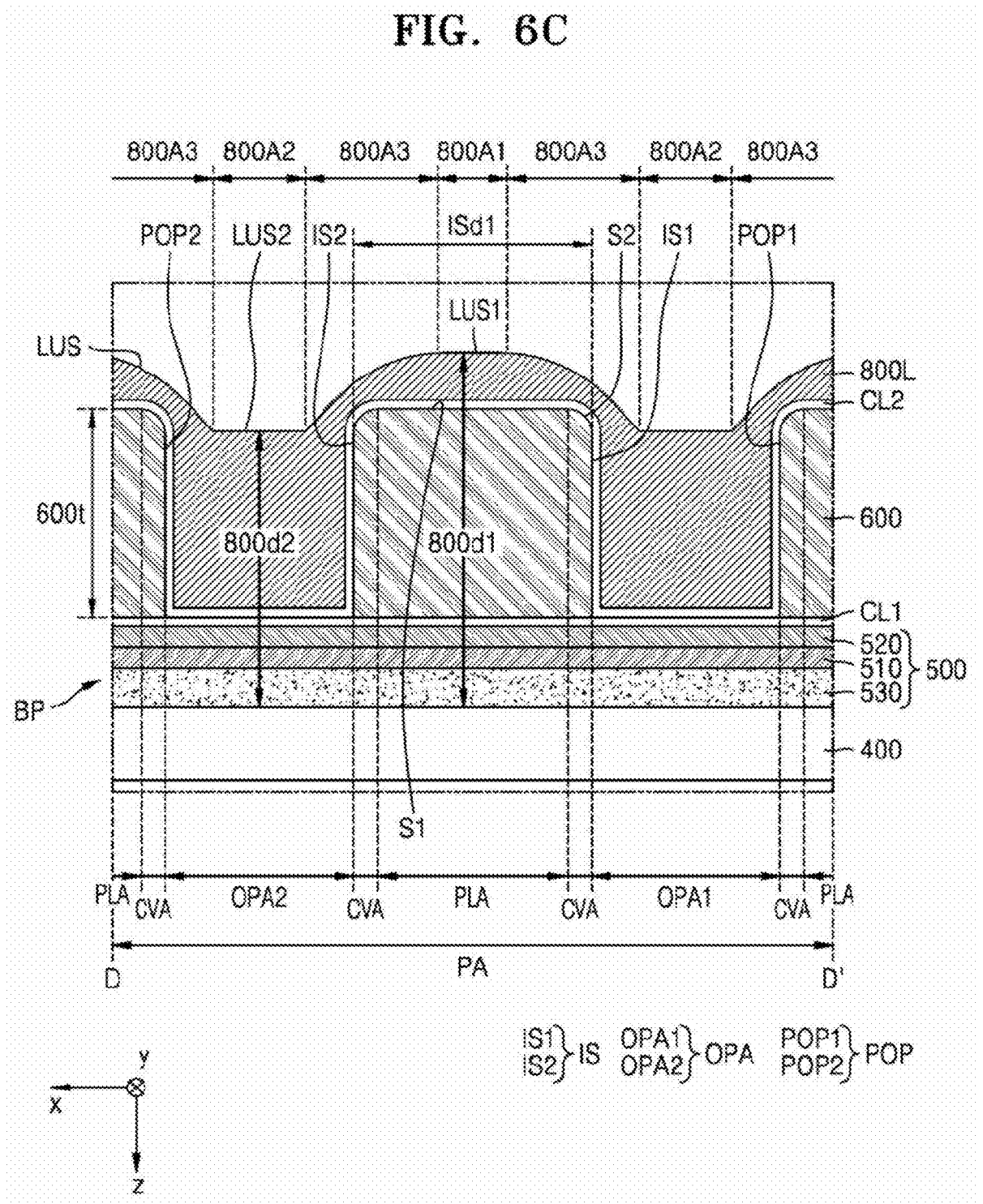
Figure 6D:
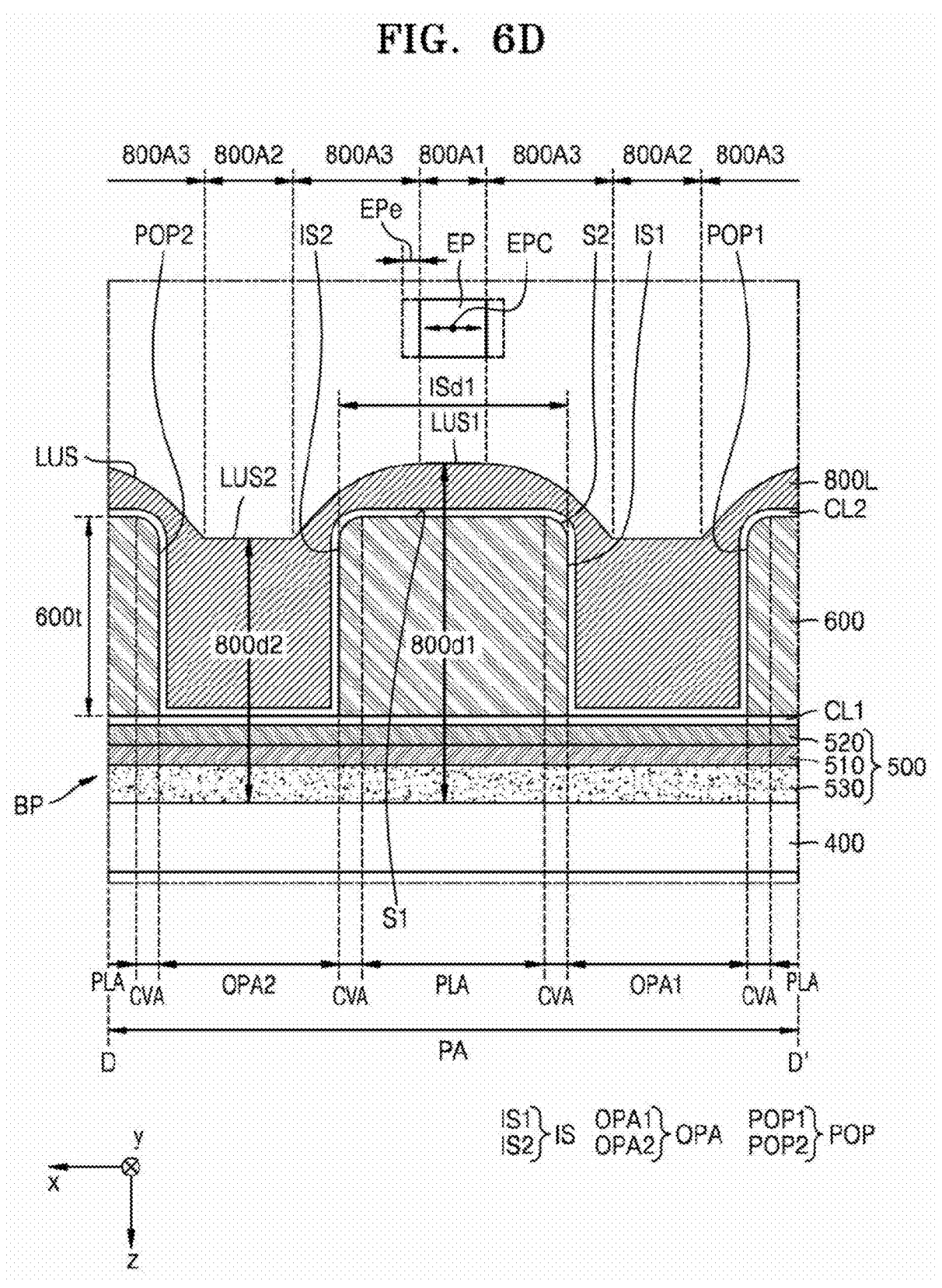
Figure 6E:
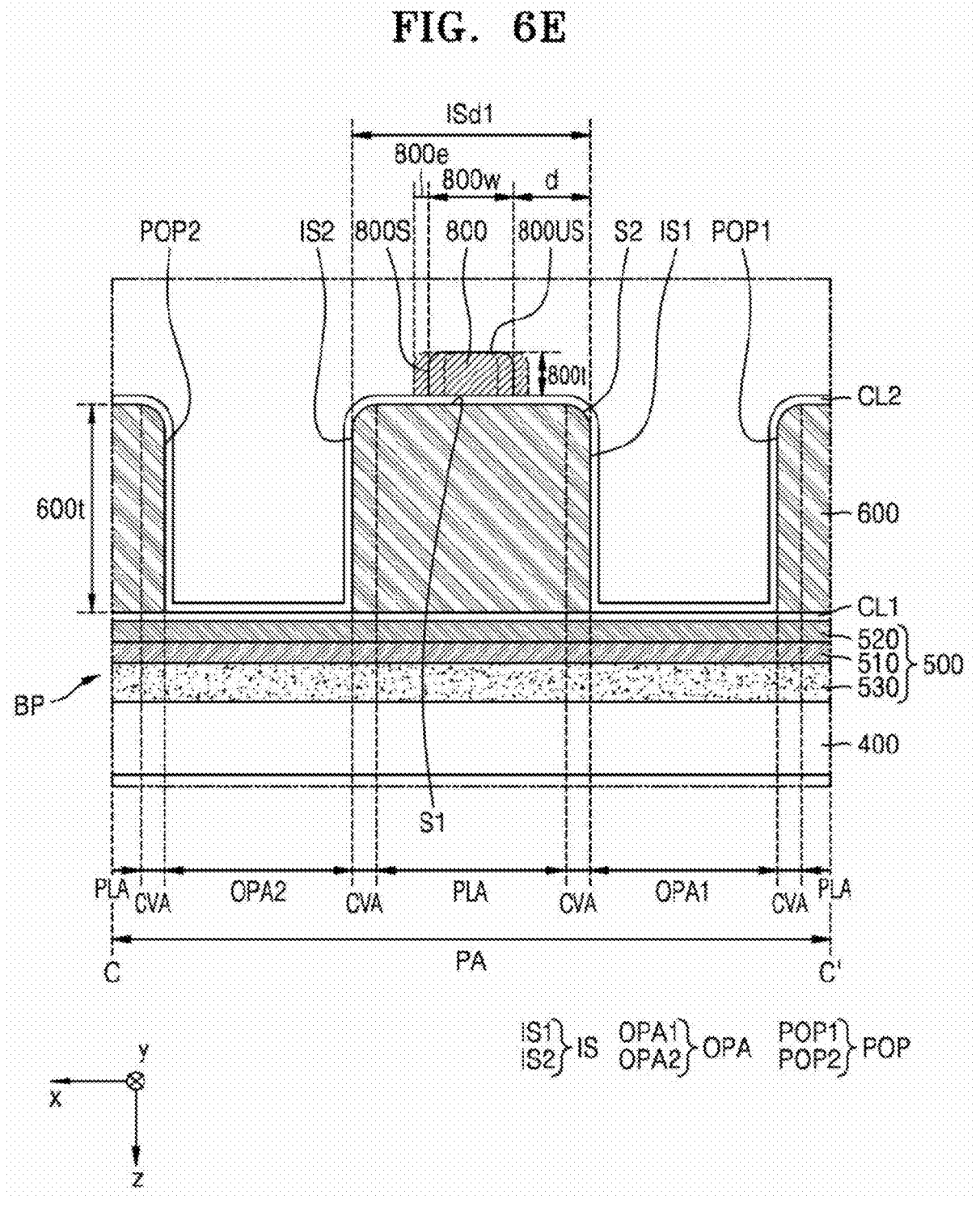

Referring to FIGS. 6C to 6E, the column spacer 800 may be disposed on the bank 600. In one or more embodiments, the column spacer 800 may be formed on the second capping layer CL2.

Referring to FIG. 6C, an organic material layer 800L may be formed on the bank 600. For example, the organic material layer 800L may be formed on the bank 600 with the second capping layer CL2 therebetween. The organic material layer 800L may include an organic material. In one or more embodiments, the organic material layer 800L may include an acryl-based material. The organic material layer 800L may continuously extend in the peripheral area PA.

An upper surface LUS of the organic material layer 800L may have a convex shape in a region overlapping the bank 600. In one or more embodiments, a distance 800d1 from the upper substrate 400 to a first upper surface LUS1 of the organic material layer 800L overlapping the bank 600 may be greater than a distance 800d2 from the upper substrate 400 to a second upper surface LUS2 of the organic material layer 800L overlapping the peripheral opening POP. This may be because the organic material of the organic material layer 800L has flowability.

The organic material layer 800L may include a first material area 800A1, a second material area 800A2, and a third material area 800A3. The first material area 800A1 may overlap the bank 600. The first material area 800A1 may be a region where the upper surface LUS of the organic material layer 800L overlaps the bank 600 and is substantially flat or has a relatively small curvature. The second material area 800A2 may overlap the peripheral opening POP. The second material area 800A2 may be a region that overlaps the peripheral opening POP, is substantially flat or has a relatively small curvature. The third material area 800A3 may be arranged between the first material area 800A1 and the second material area 800A2. The third material area 800A3 may be a region where the upper surface LUS of the organic material layer 800L is curved and has a relatively high curvature. When the planarization area PLA of the bank 600 is sufficiently wide, the first material area 800A1 may be formed narrow. Accordingly, the planarization area PLA of the bank 600 should be sufficiently wide to widen sufficiently the first material area 800A1 having a substantially flat upper surface.

Referring to FIG. 6D, an exposer EP may be aligned. The exposer EP may be aligned to overlap the first material area 800A1. In one or more embodiments, the exposer EP may be aligned to overlap the planarization area PLA. Next, the exposer EP may expose the organic material layer 800L.

In one or more embodiments, the exposer EP may not be aligned at a position set in advance. As an example, a center EPC of the exposer EP may deviate from the position set in advance by an alignment error EPe.

Referring to FIG. 6E, the organic material layer may be developed and hardened, and the outer surface 800S of the column spacer 800 may be formed. The organic material layer may be thermally hardened at temperature of about 230° C. In one or more embodiments, the width 800w of the column spacer 800 may not be formed in a width set in advance. As an example, a portion of the outer surface 800S of the column spacer 800 facing the first peripheral opening POP1 may be located closer to the first peripheral opening POP1 by a forming error 800e, or located away from the first peripheral opening POP1 by the forming error 800e. As an example, another portion of the outer surface 800S of the column spacer 800 facing the second peripheral opening POP2 may be located closer to the second peripheral opening POP2 by the forming error 800e, or located away from the second peripheral opening POP2 by the forming error 800e.

The column spacer 800 may be formed in the planarization area PLA. The column spacer 800 may be disposed on the first surface S1. In the case where the column spacer 800 is disposed on the second surface S2, the column spacer 800 may not have a shape or a thickness set in advance. In this case, the function of the column spacer 800 may not be performed. In the present embodiment, because the column spacer 800 is disposed on the first surface S1 that is flat, the column spacer 800 may have the shape or thickness set in advance.

In one or more embodiments, the thickness 800t of the column spacer 800 may be about 2.5 μm. In another embodiment, the thickness 800t of the column spacer 800 may be less or greater than 2.5 μm.

In a plan view, the distance d from the outer surface 800S of the column spacer 800 to the inner surface IS of the bank 600 defining the peripheral opening POP may be 15 μm or more. A difference between the first distance ISd1 and the width 800w of the column spacer 800 may be 30 μm or more. The first distance ISd1 is a distance between the first inner surface IS1 and the second inner surface IS2. In other words, the area of the bank 600 in which the column spacer 800 is arranged may be sufficiently maintained. This is for taking into account a margin or an error when forming the column spacer 800. In one or more embodiments, 15 μm may be a value calculated by taking into account the margin or error.

First, as described with reference to FIG. 6B, the bank 600 may include the planarization area PLA, the opening area OPA, and the curved area CVA. In this case, the column spacer 800 may be formed in the planarization area PLA, and the margin or error by the curved area CVA may be taken into account. The margin or error by the curved area CVA may be about 3 μm.

Next, as described with reference to FIG. 6C, the organic material layer 800L may include the first material area 800A1, the second material area 800A2, and the third material area 800A3. In this case, the column spacer 800 having the upper surface 800US that is flat may be formed from the organic material layer 800L of the first material area 800A1. In the case where the column spacer 800 is formed from the organic material layer 800L of the third material area 800A3, the column spacer 800 having the upper surface 800US that is curved and has a relatively high curvature may be formed. Accordingly, the margin or error due to the third material area 800A3 may be taken into account. The margin or error due to the third material area 800A3 may be about 5 µm.

Next, as described with reference to FIG. 6D, the alignment error EPe of the exposure EP may be taken into account. The margin or error by the exposer EP may be about 5 µm.

Next, as described with reference to FIG. 6E, while the organic material layer is developed and hardened, the forming error 800e, which is an error for the position of the outer surface 800S of the column spacer 800, may be taken into account. The forming error 800e may be about 2 µm.

Accordingly, during a process of forming the column spacer 800, the area of the bank 600 in which the column spacer 800 is arranged should be sufficiently wide by taking into account all the above errors. In a plan view, as a sum of all the above errors, the distance d from the outer surface 800S of the column spacer 800 to the inner surface IS of the bank 600 defining the peripheral opening POP should be 15 µm or more. In this case, the upper surface 800US of the column spacer 800 may be substantially flat or may have a small curvature. In one or more embodiments, the phenomenon that the column spacer 800 is lost may be prevented or reduced.

In one or more embodiments, in a plan view, the distance d from the outer surface 800S of the column spacer 800 to the inner surface IS of the bank 600 defining the peripheral opening POP may be in a range of about 15 µm to about 16 µm. Accordingly, the area of the peripheral openings POP arranged around the column spacer 800 may be sufficiently secured, and the forming of the functional layer 700 on the upper surface of the bank 600 may be prevented or reduced.

In one or more embodiments, the column spacer 800 may be provided in plurality on the bank 600. In other words, the plurality of column spacers 800 may be formed on the bank 600. The plurality of column spacers 800 may be apart from (e.g., be spaced from) each other. In one or more embodiments, the distance d in one of the plurality of column spacers 800 may be less than 15 µm due to a process margin. However, because the plurality of column spacers 800 each are formed on the bank 600 having a sufficient area, a phenomenon that the column spacer 800 is lost may be prevented or reduced.

Figure 6F:
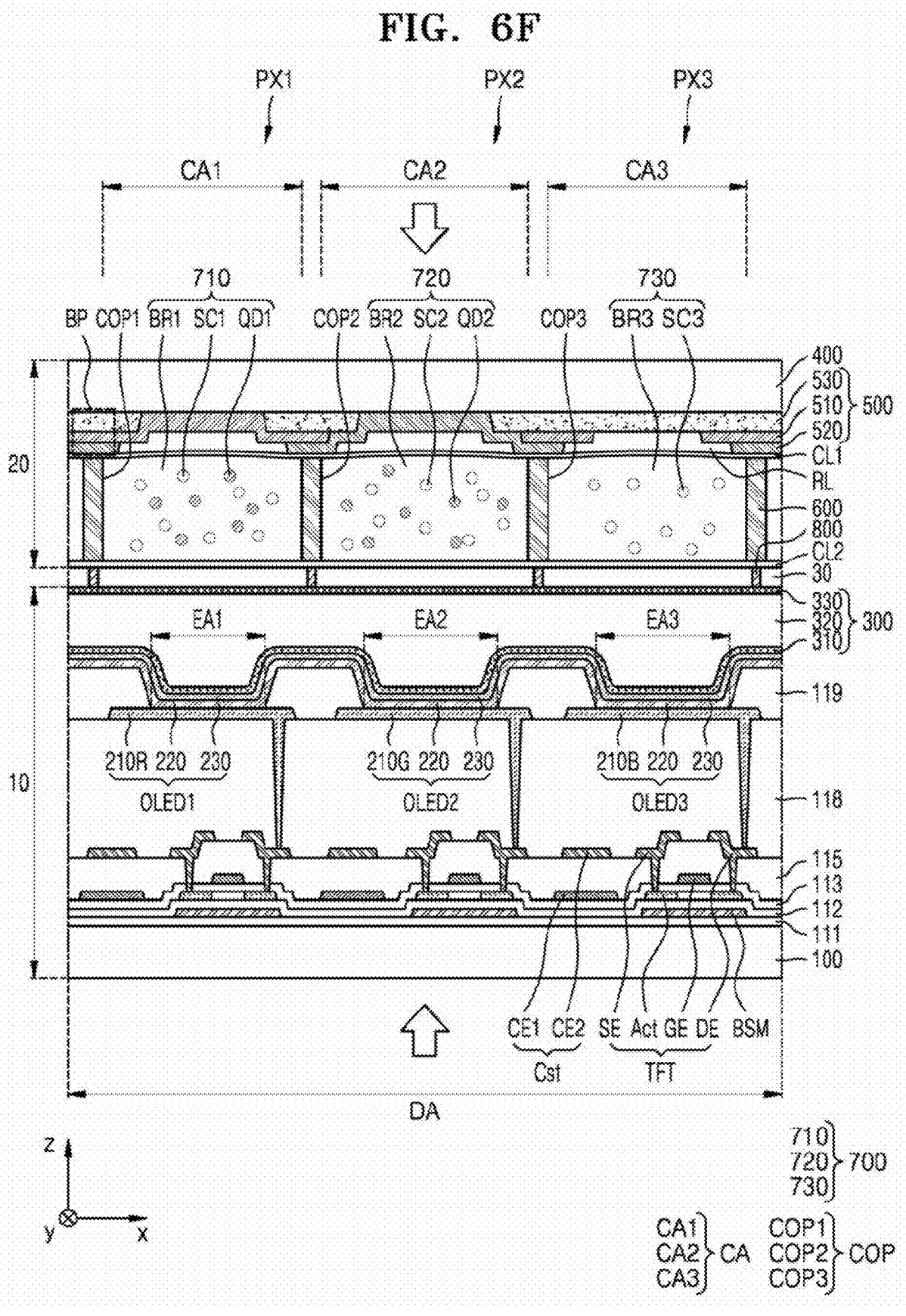

Referring to FIG. 6F, the column spacer 800 may be disposed on the encapsulation layer 300 to face the encapsulation layer 300. The filling layer 30 may be disposed between the light-emitting panel 10 and the color panel 20. In one or more embodiments, the filling layer 30 may be disposed between the encapsulation layer 300 and the bank 600. The column spacer 800 may separate the encapsulation layer 300 from the bank 600 and pass through the filling layer 30. Accordingly, the column spacer 800 may separate the light-emitting element from the functional layer 700 with a uniform interval. In one or more embodiments, the filling layer 30 may be arranged in the display area DA with a uniform thickness.

Figure 7:
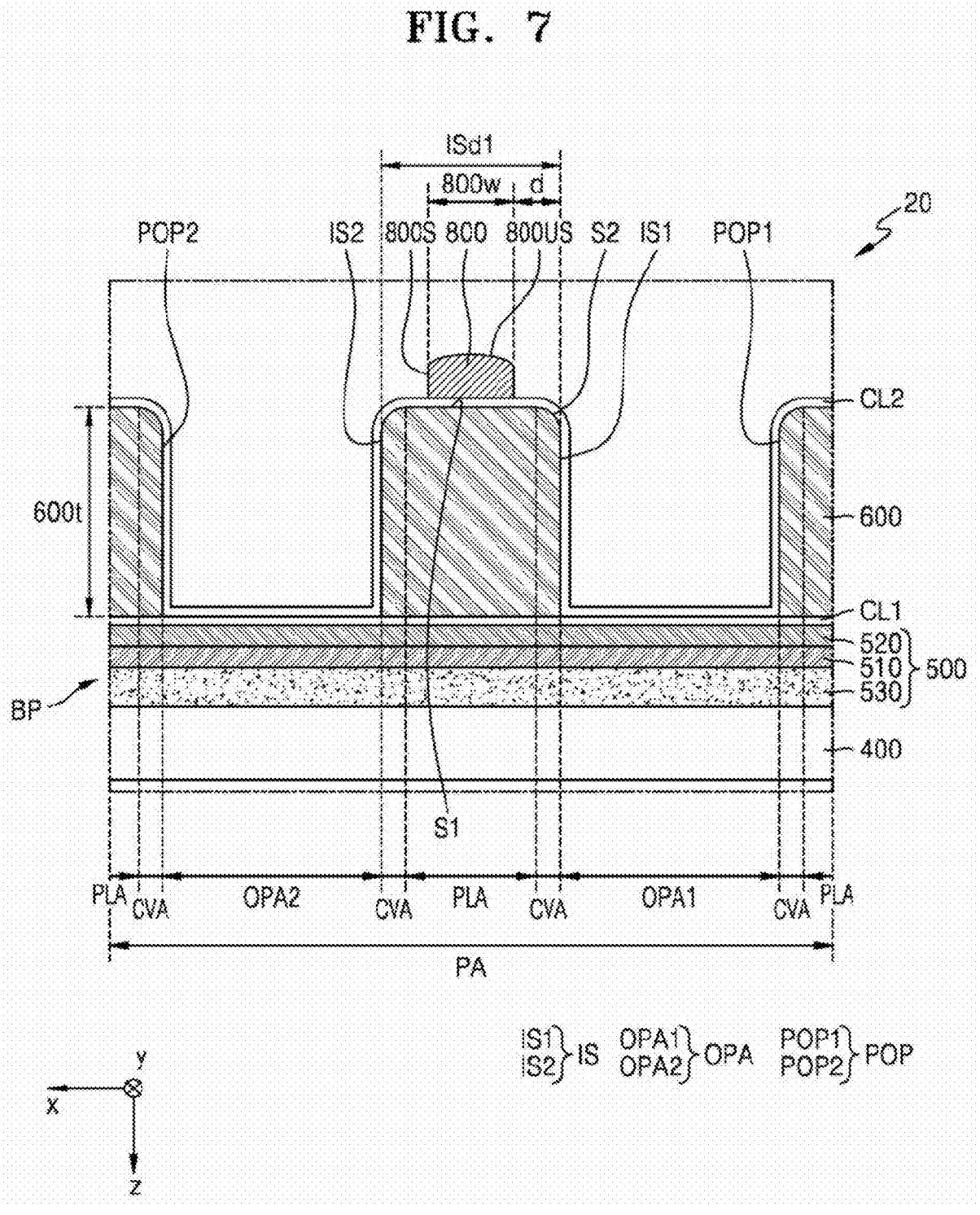
FIG. 7 is a schematic cross-sectional view of a color panel according to a comparative example.
Figure 8A:
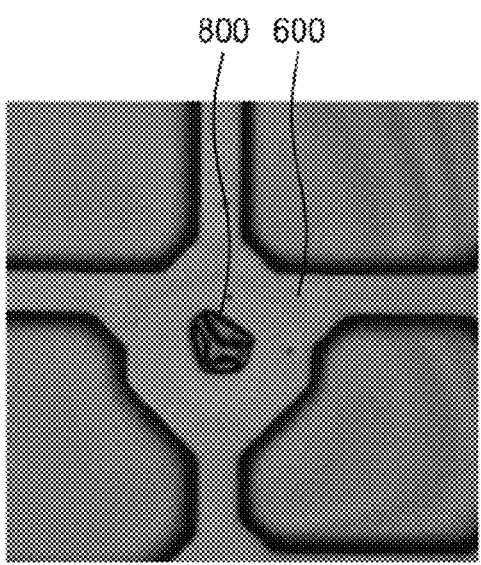
FIGS. 8A and 8B are planar images representing a column spacer formed on a bank according to a comparative example.
Figure 8B:
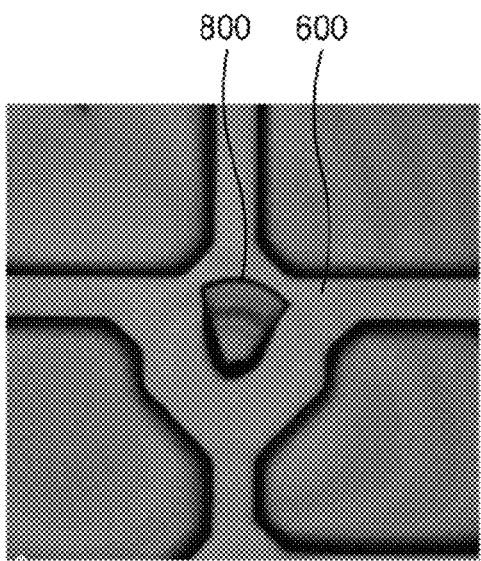

FIG. 7 is a schematic cross-sectional view of a color panel 20 according to a comparative example. FIGS. 8A and 8B are planar images representing a column spacer 800 formed on a bank according to a comparative example.

Referring to FIG. 7, in a comparative example, in a plan view, the distance d from the outer surface 800S of the column spacer 800 to the inner surface IS of the bank 600 defining the peripheral opening POP may be less than 15 µm. In other words, the area of the bank 600 in which the column spacer 800 is arranged may not be sufficient. In this case, even though the column spacer 800 is formed on the bank 600, the upper surface 800US of the column spacer 800 may not be flat. Accordingly, the function of the column spacer 800 may not be performed.

Referring to FIGS. 8A and 8B, in a plan view, the distance from the outer surface of the column spacer to the inner surface of the bank defining the peripheral opening may be designed and formed to be about 7 µm. As described above, in the case where the area of the bank 600 in which the column spacer 800 is arranged is not sufficient, the column spacer 800 may be formed in a missing state on the bank 600. Accordingly, the function of the column spacer 800 may not be performed. In contrast, according to the present embodiment, because the area of the bank 600 in which the column spacer 800 is arranged is sufficient, the upper surface of the column spacer 800 may be substantially flat or may have a small curvature, and the phenomenon that the column spacer 800 is lost may be prevented or reduced.

Figure 9A:
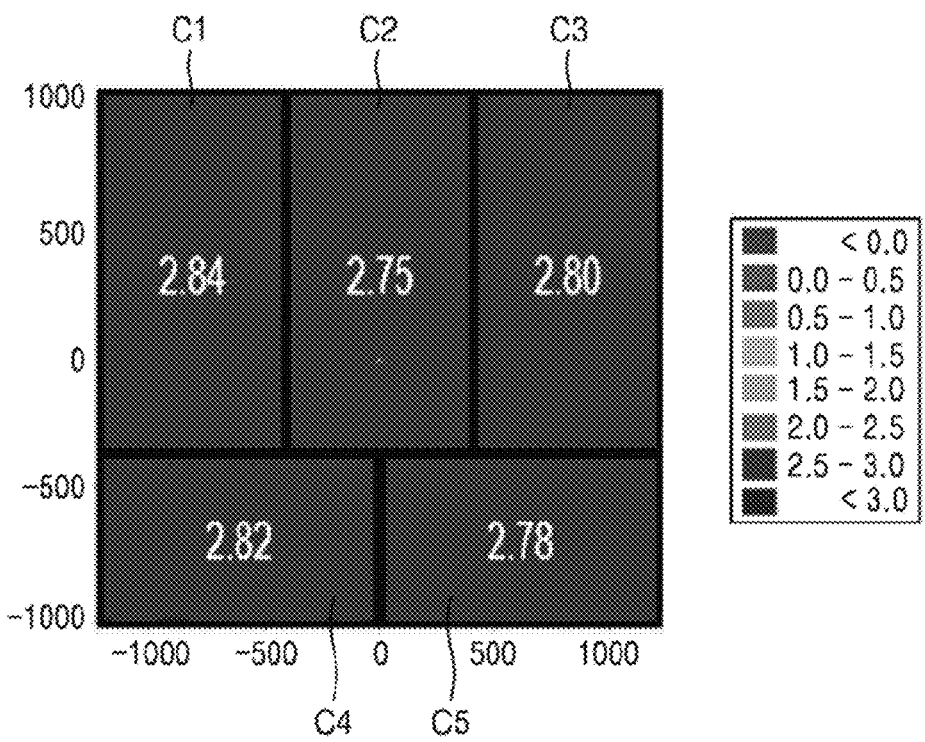
FIG. 9A is a view of an experimental result of a plurality of display apparatuses manufactured according to one or more embodiments.
Figure 9B:
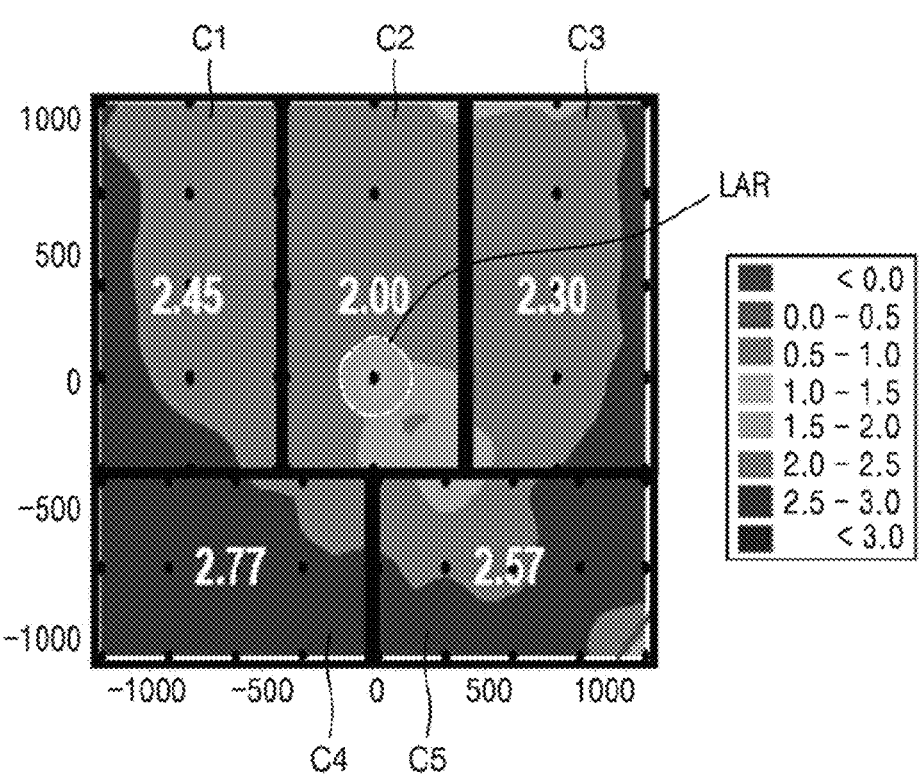
FIG. 9B is a view of an experimental result of a plurality of display apparatuses manufactured according to a comparative example.

FIG. 9A is a view of an experimental result of a plurality of display apparatuses manufactured according to one or more embodiments. FIG. 9B is a view of an experimental result of a plurality of display apparatuses manufactured according to a comparative example.

Referring to FIGS. 9A and 9B, the plurality of display apparatuses may be manufactured concurrently (e.g., simultaneously). In one or more embodiments, a plurality of cell regions may be formed on a mother substrate, a plurality of cell regions that are separated may become display apparatuses, respectively. In one or more embodiments, the plurality of cell regions may include a first cell region C1, a second cell region C2, a third cell region C3, a fourth cell region C4, and a fifth cell region C5.

Referring to FIG. 9A, in the first cell region C1, the second cell region C2, the third cell region C3, the fourth cell region C4, and the fifth cell region C5, the distance from the outer surface of the column spacer to the inner surface of the bank defining the peripheral opening was designed to be 15 µm or more. In this case, there was no cell region in which the column spacer was lost. In one or more embodiments, an average thickness of the filling layer in the first cell region C1 was measured to be about 2.84 µm. An average thickness of the filling layer in the second cell region C2 was measured to be about 2.75 µm. An average thickness of the filling layer in the third cell region C3 was measured to be about 2.80 µm. An average thickness of the filling layer in the fourth cell region C4 was measured to be about 2.82 µm. An average thickness of the filling layer in the fifth cell region C5 was measured to be about 2.78 µm. Accordingly, it was determined that the average thickness of the filling layer in the plurality of cell regions is the same in general.

Referring to FIG. 9B, the distance from the outer surface of the column spacer to the inner surface of the bank defining the peripheral opening in the first cell region C1, the second cell region C2, and the third cell region C3 was designed to be less than 15 µm. For example, the distance from the outer surface of the column spacer to the inner surface of the bank defining the peripheral opening in the first cell region C1, the second cell region C2, and the third cell region C3 was designed to be about 8 µm. In this case, it was determined that a lost area LAR was formed in the second cell region C2, and the column spacer was lost in the lost area LAR. In one or more embodiments, an average thickness of the filling layer in the first cell region C1 was measured to be about 2.45 µm. An average thickness of the filling layer in the second cell region C2 was measured to be about 2.00 µm. An average thickness of the filling layer in the third cell region C3 was measured to be about 2.30 µm.

The distance from the outer surface of the column spacer to the inner surface of the bank defining the peripheral opening in the fourth cell region C4 and the fifth cell region C5 was designed to be 15 µm or more. The lost area in which the column spacer was lost was not formed in the fourth cell region C4 and the fifth cell region C5. In one or more embodiments, an average thickness of the filling layer in the fourth cell region C4 was measured to be about 2.77 µm. An average thickness of the filling layer in the fifth cell region C5 was measured to be about 2.57 µm. For example, in the case where the distance from the outer surface of the column spacer to the inner surface of the bank defining the peripheral opening is designed to be 15 µm or more, the loss of the column spacer may be prevented or reduced and the average thickness of the filling layer may be maintained constant in the plurality of cell regions.

FIG. 10 is a table for comparing a comparative example with an embodiment.

Referring to FIG. 10, in a comparative example, in a plan view, the distance from the outer surface of the column spacer to the inner surface of the bank defining the peripheral opening may be about 7 µm. In this case, in a cross-sectional view, the upper surface of the column spacer formed on the bank may not be flat but may have a raised shape. In one or more embodiments, the column spacer may be formed in a missing state on the bank, and the function of the column spacer may not be performed.

In one or more embodiments, the distance from the outer surface of the column spacer to the inner surface of the bank defining the peripheral opening may have a range of 20 µm or more. As an example, the distance from the outer surface of the column spacer to the inner surface of the bank defining the peripheral opening may be about 20.2 µm or 21.75 µm. In this case, in a cross-sectional view, the upper surface of the column spacer 800 formed on the bank may be substantially flat or may have a small curvature, and the phenomenon that the column spacer 800 is lost may be prevented or reduced.

In the display apparatus according to one or more embodiments, the distance from the outer surface of the column spacer to the inner surface of the bank defining the peripheral opening may be 15 µm or more. In this case, when the column spacer is formed, the column spacer may have a substantially flat upper surface and may not be lost. Accordingly, the light-emitting element and the functional layer may maintain a uniform interval, and the phenomenon that brightness differs depending on positions in the display area of the display apparatus may be prevented or reduced.

In one or more embodiments, a method of manufacturing a display apparatus according to one or more embodiments may include forming the column spacer on the bank. In a plan view, the distance from the outer surface of the column spacer to the inner surface of the bank defining the peripheral opening may be 15 µm or more. Because 15 µm is a value that takes into account a process margin when forming the column spacer, the phenomenon that the column spacer is lost while the column spacer is formed may be prevented or reduced.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various suitable changes in form and details may be made therein without departing from the spirit and scope as defined by the following claims and equivalents thereof.

What is claimed is:

1. A display apparatus comprising:
   a lower substrate;
   a light-emitting element above the lower substrate and comprising an emission layer;
   an upper substrate over the lower substrate with the light-emitting element therebetween;
   a bank below a lower surface of the upper substrate facing the lower substrate, the bank defining a central opening and a peripheral opening;
   a first capping layer between the upper substrate and the bank;
   a column spacer below the bank and facing the lower substrate;
   a second capping layer between the column spacer and the bank; and
   a functional layer in the central opening between the first capping layer and the second capping layer and comprising at least one of a color-converting material or a scatterer,
   wherein a distance from an outer surface of the column spacer to an inner surface of the bank is 15 µm or more in a plan view, and
   wherein the inner surface of the bank defines the peripheral opening.

2. The display apparatus of claim 1, wherein the distance from the outer surface of the column spacer to the inner surface of the bank defining the peripheral opening is in a range of about 15 µm to about 16 µm.

3. The display apparatus of claim 1, wherein the peripheral opening includes a first peripheral opening and a second peripheral opening,
   wherein, in a plan view, the column spacer is located between the first peripheral opening and the second peripheral opening,
   wherein a difference between a first distance and a width of the column spacer is 30 µm or more, the first distance being a distance between a first inner surface of the bank and a second inner surface of the bank,
   wherein the first inner surface of the bank defines the first peripheral opening, and
   wherein the second inner surface of the bank defines the second peripheral opening.

4. The display apparatus of claim 3, wherein the peripheral opening further includes a third peripheral opening adjacent to the first peripheral opening,
   wherein a second distance between the first inner surface and a third inner surface of the bank is 30 µm or less in a plan view, and
   wherein the third inner surface of the bank defines the third peripheral opening.

5. The display apparatus of claim 1, wherein the bank further includes:
   a planarization region having a first surface that is flat;
   an opening region overlapping the peripheral opening; and a curved area arranged between the planarization region and the opening region and having a second surface that is curved, and wherein the column spacer overlaps the first surface.

6. The display apparatus of claim 1, wherein the peripheral opening includes a plurality of peripheral openings, and wherein, in a plan view, the column spacer is surrounded by the plurality of peripheral openings.

7. The display apparatus of claim 1, wherein the peripheral opening includes a plurality of peripheral openings, and wherein, in a plan view, the plurality of peripheral openings surrounds the central opening.

8. The display apparatus of claim 1, wherein the color-converting material comprises quantum dots.

9. A display apparatus comprising:

a lower substrate;

a light-emitting element on the lower substrate and comprising an emission layer;

an upper substrate over the lower substrate with the light-emitting element therebetween;

a bank on a lower surface of the upper substrate facing the lower substrate, the bank including a central opening and a peripheral opening;

a functional layer in the central opening and comprising at least one of a color-converting material or a scatterer;

a column spacer on the bank and facing the lower substrate; and a color filter layer located between the upper substrate and the bank, wherein a distance from an outer surface of the column spacer to an inner surface of the bank is 15 μm or more in a plan view, wherein the inner surface of the bank defines the peripheral opening wherein the color filter layer comprises a first color filter, a second color filter, and a third color filter to pass light in different wavelength bands from each other, and wherein the first color filter, the second color filter, and the third color filter constitute a light-blocking unit overlapping the peripheral opening.

10. A display apparatus comprising:

a lower substrate;

a light-emitting element on the lower substrate and comprising an emission layer;

an upper substrate over the lower substrate with the light-emitting element therebetween;

a bank on a lower surface of the upper substrate facing the lower substrate, the bank including a central opening and a peripheral opening;

a functional layer in the central opening and comprising at least one of a color-converting material or a scatterer;

a column spacer on the bank and facing the lower substrate;

an encapsulation layer covering the light-emitting element; and a filling layer located between the encapsulation layer and the bank, wherein a distance from an outer surface of the column spacer to an inner surface of the bank is 15 μm or more in a plan view, wherein the inner surface of the bank defines the peripheral opening, and wherein the column spacer separates the encapsulation layer from the bank and passes through the filling layer.

* * * * *